United States Patent
Song et al.

(10) Patent No.: US 10,410,578 B2
(45) Date of Patent: Sep. 10, 2019

(54) ORGANIC LIGHT EMITTING DISPLAY DEVICE

(71) Applicant: SAMSUNG DISPLAY CO., LTD., Yongin, Gyeonggi-Do (KR)

(72) Inventors: Hee-Rim Song, Seoul (KR); Yong-Koo Her, Yongin-si (KR); Mu-Kyung Jeon, Ulsan (KR); Jong-Hee Kim, Yongin-si (KR); Chong-Chul Chai, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 199 days.

(21) Appl. No.: 14/789,334

(22) Filed: Jul. 1, 2015

(65) Prior Publication Data

US 2016/0217744 A1 Jul. 28, 2016

(30) Foreign Application Priority Data

Jan. 27, 2015 (KR) .......................... 10-2015-0012485

(51) Int. Cl.
*G09G 3/3233* (2016.01)
*G09G 3/3291* (2016.01)
*H01L 51/52* (2006.01)

(52) U.S. Cl.
CPC ......... *G09G 3/3233* (2013.01); *G09G 3/3291* (2013.01); *H01L 51/52* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2310/0297* (2013.01); *G09G 2320/0209* (2013.01); *G09G 2320/043* (2013.01)

(58) Field of Classification Search
CPC combination set(s) only.
See application file for complete search history.

(56) References Cited

U.S. PATENT DOCUMENTS

| | | | | |
|---|---|---|---|---|
| 2002/0149320 A1* | 10/2002 | Maruyama | ........... | G09G 3/3233 315/169.3 |
| 2006/0038765 A1* | 2/2006 | Lee | ...................... | G09G 3/3648 345/100 |
| 2007/0001937 A1* | 1/2007 | Park | ...................... | G09G 3/3233 345/76 |
| 2008/0024529 A1* | 1/2008 | Asano | .................. | G09G 3/3233 345/697 |

(Continued)

FOREIGN PATENT DOCUMENTS

| KR | 10-2009-0105450 A | 10/2009 |
|---|---|---|
| KR | 10-2015-0010603 A | 1/2015 |

*Primary Examiner* — Temesghen Ghebretinsae
*Assistant Examiner* — Sosina Abebe
(74) *Attorney, Agent, or Firm* — Lee & Morse, P.C.

(57) ABSTRACT

An organic light emitting display device includes a plurality of pixel columns, a first data wiring, a second data wiring, and a power supply wiring. The pixel columns include pixels repeatedly arranged in a first direction, and the pixel columns are repeatedly arranged in a second direction. The first and second directions are substantially perpendicular to each other. The first data wiring extends in the first direction and is connected to the pixels in an even row. The second data wiring extends in the first direction and are connected to the pixels in an odd row. The power supply wiring extends in the first direction between the first and second data wirings.

22 Claims, 18 Drawing Sheets

(56) References Cited

U.S. PATENT DOCUMENTS

| | | | |
|---|---|---|---|
| 2008/0048951 A1 | 2/2008 | Naugler et al. | |
| 2008/0106554 A1 | 5/2008 | Tsai et al. | |
| 2009/0160749 A1* | 6/2009 | Lee | G09G 3/3648 |
| | | | 345/95 |
| 2009/0167648 A1* | 7/2009 | Jeon | G09G 3/3233 |
| | | | 345/76 |
| 2010/0171725 A1* | 7/2010 | Tsai | G09G 3/20 |
| | | | 345/205 |
| 2012/0050344 A1 | 3/2012 | Kim et al. | |
| 2013/0321375 A1* | 12/2013 | Ka | G09G 3/3233 |
| | | | 345/212 |
| 2014/0132584 A1* | 5/2014 | Kim | G09G 3/3696 |
| | | | 345/212 |
| 2015/0061983 A1* | 3/2015 | Kim | G09G 3/3233 |
| | | | 345/82 |
| 2015/0228223 A1* | 8/2015 | Park | G09G 3/3208 |
| | | | 345/77 |
| 2016/0049454 A1* | 2/2016 | Park | H01L 27/3276 |
| | | | 257/40 |
| 2016/0148578 A1* | 5/2016 | Kishi | G09G 3/3233 |
| | | | 345/212 |

\* cited by examiner

FIRST DIRECTION
SECOND DIRECTION

ORGANIC LIGHT EMITTING DISPLAY DEVICE

CROSS-REFERENCE TO RELATED APPLICATION

Korean Patent Application No. 10-2015-0012485, filed on Jan. 27, 2015, and entitled, "Organic Light Emitting Display Device," is incorporated by reference herein in its entirety.

BACKGROUND

1. Field

One or more embodiments described herein relate to an organic light emitting display device.

2. Description of the Related Art

An organic light emitting display device generates images based on light emitted from a plurality of pixels. The light emitted from each pixel is generated by an organic light emitting diode. The wavelength of light from the diode may be based on the type of organic material in a light-emitting layer. The type of organic material may differ, for example, based on the color of light to be emitted. The brightness or intensity of light is based on current controlled by a driving transistor. As the resolution of the display increases, the driving time of the organic light emitting diodes may decrease.

SUMMARY

In accordance with one or more embodiments, an organic light emitting display device includes a plurality of pixel columns on a substrate, the pixel columns including a plurality of pixels repeatedly arranged in a first direction, the pixel columns being repeatedly arranged along a second direction, the first direction and the second direction being substantially parallel to a top surface of the substrate and substantially perpendicular to each other; a first data wiring extending in the first direction, the first data wiring connected to the pixels in an even row; a second data wiring extending in the first direction, the second data wiring connected to the pixels in an odd row; and a first power supply wiring extending in the first direction between the first data wiring and the second data wiring.

Each of the pixels may include an active pattern including a first region, a second region, and a third region on the substrate; a first gate electrode partially overlapping the active pattern, a first transistor including the first gate electrode, the first region, and the second region; and a second gate electrode partially overlapping the active pattern, a second transistor including the second gate electrode, the second region, and the third region, the first transistor to generate a driving current to be supplied to an organic light emitting diode.

The active pattern may include a fourth region, a fifth region, a sixth region, and a seventh region, and a third transistor includes the second gate electrode, the first region, and the seventh region. The first data wiring may be connected to the fourth region of the active pattern corresponding to the pixels in the even row, and the second data wiring may be connected to the fourth region of the active pattern corresponding to the pixels in the odd row.

Each of the pixels may include a second gate electrode overlapping the active pattern, a third transistor including the second gate electrode, the first region, and the fourth region, and a fourth transistor includes the second gate electrode, the second region, and the fifth region; a third gate electrode partially overlapping the active pattern, the second transistor including fourth third gate electrode, the fifth region, and the sixth region; and a fifth gate electrode partially overlapping the active pattern, the third transistor including the fifth gate electrode, the sixth region, and the third region.

The active pattern and the first to fifth gate electrodes corresponding to the pixels in the even row may be symmetrical with the active pattern and the first to fifth gate electrodes of the pixels in the odd row with respect to an axis extending in the first direction. The active pattern and the first to fifth gate electrodes corresponding to the pixels in the even row may be symmetrical with the active pattern and the first to fifth gate electrodes corresponding to the pixels in the odd row with respect to an axis extending in the second direction.

A portion of the active pattern corresponding to the pixels in the even row which overlap the first gate electrode may have substantially a same shape as a portion of the active pattern corresponding to the pixels in the odd row which overlaps the first gate electrode and a remaining portion of the active pattern corresponding to the pixels in the even row and the firth to fifth electrodes may be symmetrical with a remaining portion of the active pattern corresponding to the pixels in the odd row and the first to fifth electrodes with respect to an axis extending in the first direction.

The device may further include as claimed in claim 2, a plurality of pixel electrodes, each of the pixel electrodes connected to the third region of the active pattern; an organic light emitting layer on each of the pixel electrodes; and a common electrode on the organic light emitting layer, wherein a light emitting diode includes one of the pixel electrodes, the organic light emitting layer, and the common electrode. The pixel electrodes may be arranged along the first direction and the second direction and are staggered relative to each other.

The pixel electrodes may include a first pixel electrode connected to one of the pixels in the odd row of an even pixel column, the first pixel electrode in a first light emitting diode emitting a first color; a second pixel electrode connected to one of the pixels in the even row of the even pixel column, the second pixel electrode in a second light emitting diode emitting a second color; a third pixel electrode connected to one of the pixels in the odd row of an odd pixel column, the third pixel electrode in a third light emitting diode emitting a third color; and a fourth pixel electrode connected to one of the pixels in the even row of the odd pixel column, the fourth pixel electrode in a fourth light emitting diode emitting a third color.

The pixel electrodes may include a first pixel electrode connected to one of the pixels in the even row of an even pixel column, the first pixel electrode in a first light emitting diode emitting a first color; a second pixel electrode connected to one of the pixels in the even row of an odd pixel column, the second pixel electrode in a second light emitting diode emitting a second color; a third pixel electrode connected to one of the pixels in the odd row of the even pixel column, the third pixel electrode in a third light emitting diode emitting a third color; and a fourth pixel electrode connected to one of the pixels in the odd row of the odd pixel column, the fourth pixel electrode in a fourth light emitting diode emitting a third color. The first color may be red, the second color may be blue, and the third color may be green.

The pixel electrodes may have a substantially diamond shape including sides extending in the first direction and the second direction. The device may include a connecting portion integral with the pixel electrodes. The first power supply wiring may be supplied with an internal voltage, the first data wiring may be supplied with an even data signal, and the second data wiring may be supplied with an odd data signal. The first data wiring and the second data wiring may be connected to a demultiplexer.

The even data signal and the odd data signal may be separated in time. A driving time of one of the pixels in the odd row partially may overlap a driving time of an adjacent one of the pixels in the even row. A channel of the first transistor in one of the pixels of the even row and a channel of the first transistor in one of the pixels of the odd row may have substantially a same planar shape.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
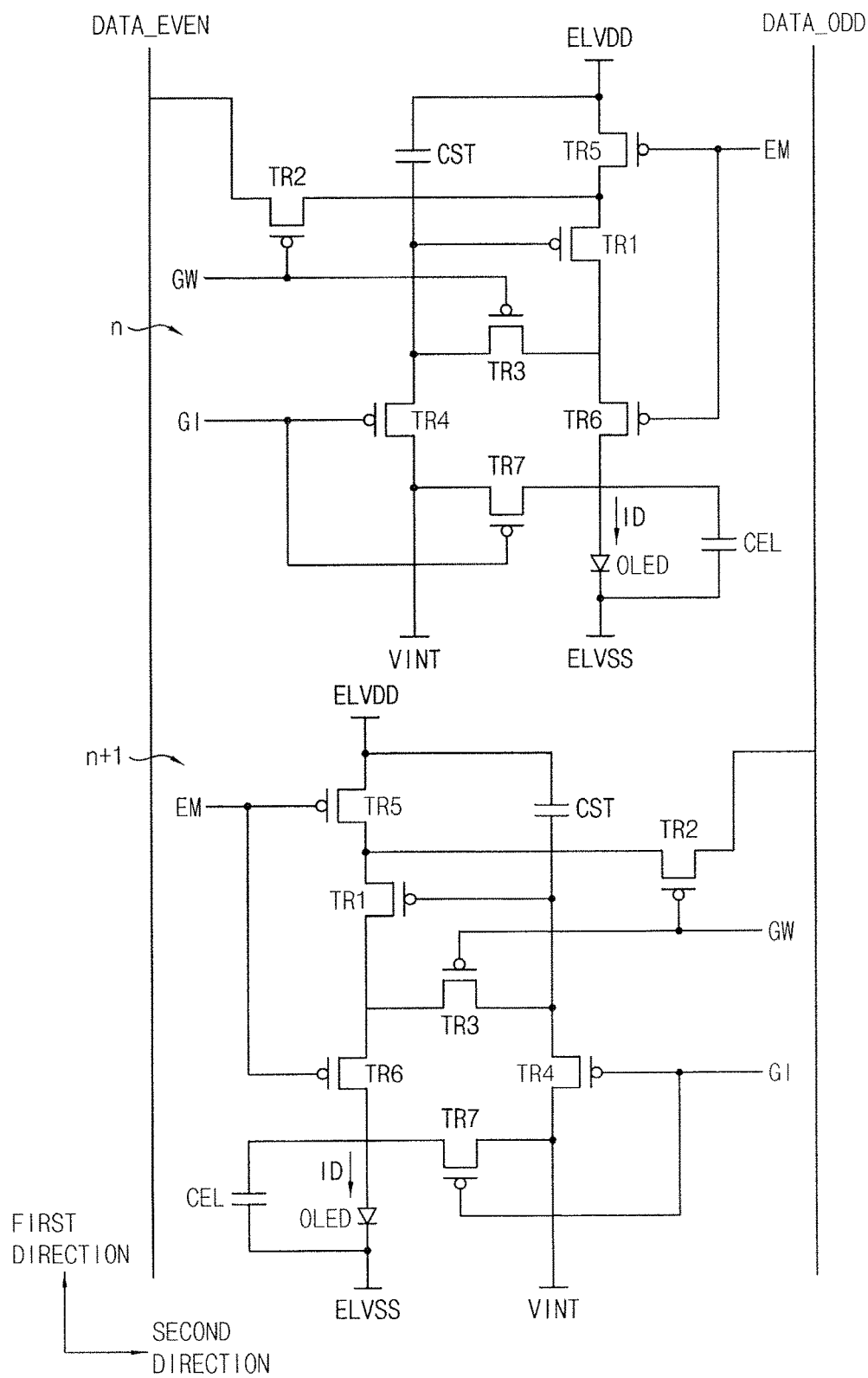
FIG. 1 illustrates an embodiment of an organic light emitting display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

FIG. 1 illustrates an embodiment of pixels of an organic light emitting display device. Referring to FIG. 1, the pixels include a pixel (N) in an even-numbered row (even row) in a first direction and a pixel (N+1) in an odd-numbered row (odd row). Each of the pixels (N, N+1) includes organic light emitting diode (OLED), a first transistor (TR1), a second transistor (TR2), a third transistor (TR3), a storage capacitor (CST), a forth transistor (TR4), a fifth transistor (TR5), a sixth transistor (TR6) and a seventh transistor (TR7). According to some example embodiments, each of the pixels (N, N+1) may further include cell capacitor (CEL) formed by a parasitic capacitor.

The organic light emitting diode emits light based on a driving current (ID). The organic light emitting diode includes a first electrode and a second electrode. The second electrode may be supplied with a second power supply voltage (ELVSS). The first electrode may be an anode and the second electrode may be cathode, or vice versa.

The first transistor (TR1) includes a gate electrode, a first electrode, and a second electrode. The first electrode may be a source electrode and the second electrode may be drain electrode, or vice versa. The first transistor generates driving current (ID).

The first transistor (TR1) may operate in a saturation region. In this case, the first transistor (TR1) generates the driving current (ID) based on a voltage difference between the gate electrode and the source electrode. A gradation (e.g., grayscale) of light may be expressed based on the magnitude of the driving current (ID) supplied to the organic light emitting diode.

In another embodiment, the first transistor (TR1) may operate in a linear region. In this case, gradation of light may be expressed based on a sum of a time in which a driving current is supplied to the organic light emitting diode in one frame.

The second transistor (TR2) includes a gate electrode, a first electrode, and a second electrode. The gate electrode may be supplied with a scan signal (SW) of a current stage. The first electrode may be supplied an odd-numbered data signal (DATA_EVEN). For the second transistor (TR2), the second electrode may be connected to the first electrode of the first transistor (TR1). The first electrode may be a source electrode and the second electrode may be a drain electrode, or vice versa.

The second transistor (TR2) supplies the odd-numbered data signal (DATA_EVEN) to the first electrode of the first transistor (TR1) in active period of the scan signal (SW) of a current stage. In this case, the second transistor (TR2) may be operating in a linear region.

The third transistor (TR3) includes a gate electrode, a first electrode, and a second electrode. The gate electrode may be supplied with a scan signal (SW) of a current stage. The first electrode may be connected to the second electrode of the first transistor (TR1). For the third transistor (TR3), the second electrode may be connected to the gate electrode of the first transistor (TR1). The first electrode may be a source electrode and the second electrode may be a drain electrode, or vice versa.

The third transistor (TR3) connects the gate electrode of the first transistor (TR1) with the second electrode of the first transistor (TR1) in an active period of the scan signal (SW) of a current stage. In this case, the third transistor (TR3) may operate in a linear region. For example, the third transistor (TR3) may connect the first transistor (TR1) with the diode in an active period of the scan signal (SW) of a current stage. Since the first transistor (TR1) is connected to the diode, a voltage difference may occur between the first electrode of the first transistor (TR1) and the gate electrode of the first transistor (TR1) in an amount that corresponds to the threshold voltage of the first transistor (TR1). Therefore, a summed voltage, a voltage of an even-numbered data signal (DATA_EVEN) supplied to the first electrode of the first transistor (TR1) in an active area of the scan signal (GW) of a current stage and the voltage difference (e.g., the threshold voltage), may be supplied to the gate electrode of the first transistor (TR1). In other words, in one embodiment, the even-numbered data signal (DATA_EVEN) may be compensated as much as the threshold voltage of the first transistor (TR1), and the compensated even-numbered data signal (DATA_EVEN) may be supplied to the gate electrode of the first transistor (TR1). As the threshold voltage compensation may be performed, it will be clear that a driving current is uneven by a threshold voltage deviation of the first transistor.

The storage capacitor (CST) may be connected between the first power supply voltage (ELVDD) and the gate electrode of the first transistor (TR1). The storage capacitor (CST) may maintain a voltage level of the gate electrode of the first transistor (TR1) in an inactive period of the scan signal (SW) of a current stage. The inactive period of the scan signal (SW) of a current stage may include an active period of a light emitting signal (EM), and a driving current generated by the transistor in an active period of a light emitting signal (EM) may be supplied to the organic light emitting diode. Therefore, the driving current (ID) generated by the first transistor based on the voltage level maintained by the storage capacitor (CST) may be supplied to the organic light emitting diode.

The fourth transistor (TR4) includes a gate electrode, a first electrode, and a second electrode. The gate electrode may be supplied a gate initial signal (GI). The first electrode may be supplied an internal voltage (VINT). The second electrode may be connected to the gate electrode of the first transistor (TR1). For the fourth transistor (TR4), the first electrode may be a source electrode and the second electrode may be a drain electrode, or vice versa.

The fourth transistor (TR4) may supply the internal voltage (VINT) to the gate electrode of the first transistor (TR1) in an active period of the gate initial signal (GI). In this case, the fourth transistor (TR4) may be operating in a linear region. For example, the fourth transistor (TR4) may initialize the gate electrode of the first transistor (TR1) to the internal voltage (VINT) during the active period of the gate initial signal (GI). Therefore, the gate initial signal (GI) may perform as a data initial signal.

In some example embodiment, a voltage level of the internal voltage (VINT) may be sufficiently lower than a voltage level of an even-numbered data signal (DATA_EVEN) maintained by the storage capacitor (CST) in previous frame. The internal voltage (VINT) may be supplied to the gate electrode of the first transistor (TR1) as PMOS (P-channel Metal Oxide Semiconductor) transistor. In some example embodiment, the internal voltage level (VINT) may be sufficiently higher than a voltage level of an even-numbered data signal (DATA_EVEN) maintained by the storage capacitor (CST) in previous frame. The internal voltage (VINT) may be supplied to the gate electrode of the first transistor (TR1) as NMOS (N-channel Metal Oxide Semiconductor) transistor.

According to one embodiment, the gate initial signal (GI) may correspond to a signal substantially equal to the scan signal (GW) of a current stage activated in one previous stage. For example, the gate initial signal (GI) supplied to a pixel in a m-th row (m is an integer of 2 or more) may be substantially equal to a scan signal (SW) of a current stage supplied to a pixel in an (m−1)-th row. That is, as an activated scan signal (GW) of a current stage may be supplied to the pixel in the (m−1)-th row, an activated gate initial signal (GI) may be supplied to the pixel in the m-th row. Therefore, an even-numbered data signal (DATA_EVEN) may be supplied to the pixel in (m−1)-th row, and at the same time the gate electrode of the first transistor in the pixel in the m-th row may be initialized to the internal voltage (VINT).

The fifth transistor (TR5) includes a gate electrode, a first electrode, and a second electrode. The gate electrode may be supplied a gate initial signal (GI). The first electrode may be supplied the first power supply voltage (ELVDD). The second electrode may be connected to the first electrode of the first transistor (TR1). For the fifth transistor (TR5), the first electrode may be a source electrode and the second electrode may be a drain electrode, or vice versa.

The fifth transistor (TR5) may supply the first power supply voltage (ELVDD) to the first electrode of the first transistor (TR1) during an active period of a light emitting signal (EM). In another embodiment, the fifth transistor (TR5) may not supply the first power supply voltage (ELVDD) during an inactive period of a light emitting signal (EM). In this case, the fifth transistor (TR5) may operate in a linear region. As the fifth transistor (TR5) may supply the first power supply voltage (ELVDD) to the first electrode of the first transistor (TR1) during the active period of the light emitting signal (EM), the first transistor (TR1) may generate a driving current (ID). As the fifth transistor (TR5) may stop the supply of the first power supply voltage (ELVDD), an even-numbered data signal (DATA_EVEN) supplied to the first electrode of the first transistor (TR1) may be supplied to the gate electrode of the first transistor (TR1).

The sixth transistor (TR6) includes a gate electrode, a first electrode, and a second electrode. The gate electrode may be supplied a light emitting signal (EM). The first electrode may be connected to the second electrode of the first transistor (TR1). The second electrode may be connected to the first electrode of an organic light emitting diode. For the sixth transistor (TR6), the first electrode may be a source electrode and the second electrode may be a drain electrode, or vice versa.

The sixth transistor (TR6) supplies the driving current (ID) generated by the first transistor (TR1) to the organic light emitting diode during the active period of the light emitting signal (EM). In this case, the sixth transistor (TR6) may operate in a linear region. That is, the sixth transistor (TR6) may supply the driving current (ID) generated by the first transistor (TR1) to the organic light emitting diode during the active period of the light emitting signal (EM), and thus the organic light emitting diode may emit light. As the sixth transistor (TR6) may be electrically separating the first transistor (TR1) and the organic light emitting diode during an inactive period of the light emitting signal (EM), an even-numbered data signal (DATA_EVEN)—an even-numbered data signal compensated by a threshold voltage—supplied to the second electrode of the first transistor (TR1) may be supplied to the gate electrode of the first transistor (TR1).

The seventh transistor (TR7) includes a gate electrode, a first electrode, and a second electrode. The gate electrode may be supplied a gate initial signal (GI). The first electrode may be supplied an internal voltage (VINT). The second electrode may be connected to the first electrode of the organic light emitting diode. For the seventh transistor (TR7), the first electrode may be a source electrode and the second electrode may be a drain electrode, or vice versa.

The seventh transistor (TR7) may supply the internal voltage (VINT) to the organic light emitting diode during the active period of the gate initial signal (GI). In this case, the seventh transistor (TR7) may operate in a linear region. That is, the seventh transistor (TR7) may initialize the first electrode of the organic light emitting diode as the internal voltage (VINT) during the active period of the gate initial signal (GI).

In another embodiment, the pixel (N+1) in the odd row may have symmetrical structure in the pixel (N) in the even row. For example, the organic light emitting diode, the first transistor (TR1), the second transistor (TR2), the third transistor (TR3), a storage capacitor (CST), the fourth transistor (TR4), the fifth transistor (TR5), the sixth transistor (TR6), and the seventh transistor (TR7) in the pixel (N+1) in the odd row may be connected in a manner similar as described above. However, the first electrode of the second transistor (TR2) may be supplied an odd-numbered data signal (DATA_ODD), and the second electrode may be connected to the first electrode of the first transistor (TR1).

Figure 2:
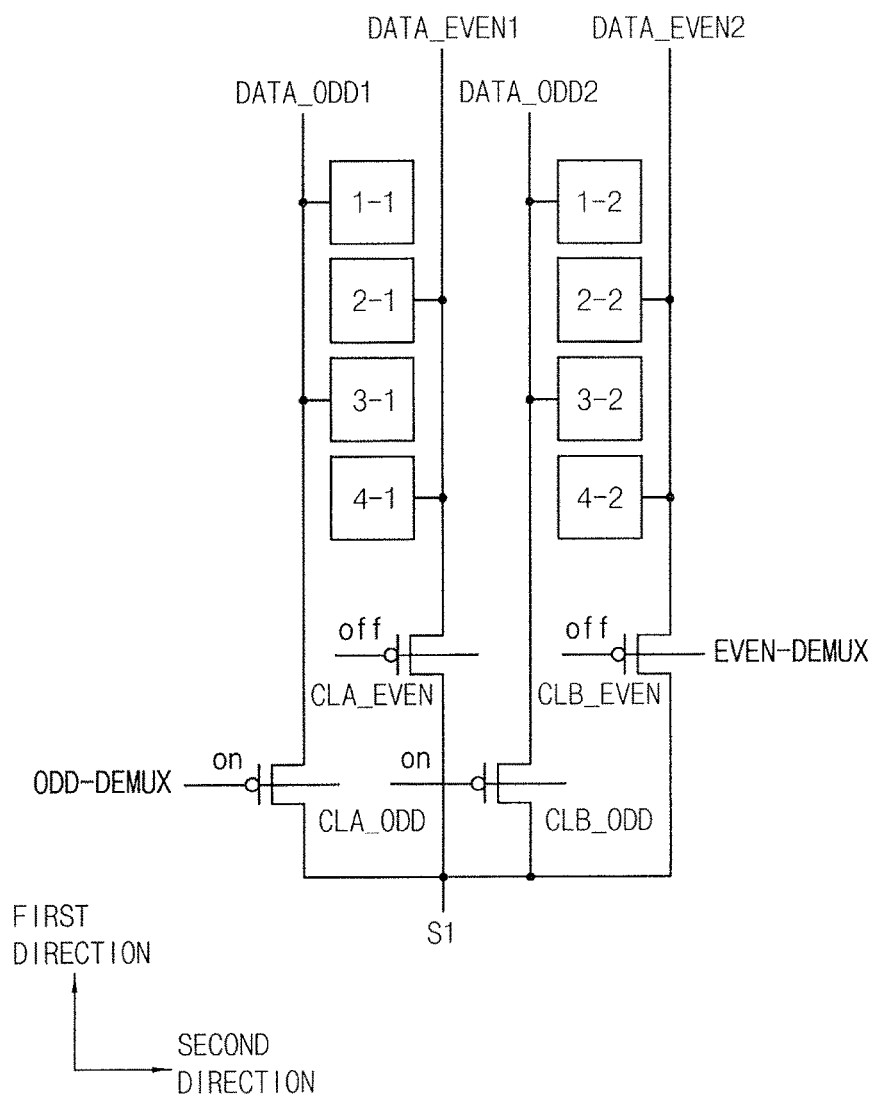
FIG. 2 illustrates an embodiment of pixels and data wiring of the display.

FIG. 2 illustrates an embodiment of a plurality of data wirings (DATA_ODD1, DATA_ODD2, DATA_EVEN1, DATA_EVEN2) and pixels (1-1, 2-1, 3-1, 4-1, 1-2, 2-2, 3-2, 4-2). The pixels (1-1, 2-1, 3-1, 4-1, 1-2, 2-2, 3-2, 4-2) may be arranged in a first direction and a second direction perpendicular to the first direction. The pixels (1-1, 2-1, 3-1, 4-1) are arranged in a first pixel column in the first direction. The pixels (1-2, 2-2, 3-2, 4-2) are arranged in a second pixel column in the first direction. The pixel columns may be arranged along the second direction. Each of the pixels may include a plurality of transistors (TR1-TR7), an organic light emitting diode, and one or more capacitors, as described, for example, in FIG. 1.

The data wirings (DATA_ODD1, DATA_ODD2, DATA_EVEN1, DATA_EVEN2) extend in the first direction. Two data wirings are arranged to correspond to one pixel column. In some example embodiments, the first even-numbered data wiring (DATA_EVEN1) and the first odd-numbered data wiring (DATA_ODD1) may correspond to the first pixel column including the pixels (1-1, 2-1, 3-1, 4-1) in the first column, and the second even-numbered data wiring (DATA_EVEN2) and the second odd-numbered data wiring (DATA_ODD2) may correspond to the second pixel column including pixels (1-2, 2-2, 3-2, 4-2) in the second column.

Therefore, the first even-numbered data wirings (DATA_EVEN1) may be connected to the pixels (2-1, 4-1) in an even row for the first pixel column, and the first odd numbered data wirings (DATA_ODD1) may be connected to the pixels (1-1, 3-1) in an odd row for the first pixel column.

A signal generated from one signal source (S1) may pass through a demultiplexer (DEMUX_EVEN, DEMUX_ODD). As a result, the signal may be transferred to one or more outputs, and the signal may be transported to data wirings (DATA_ODD1, DATA_ODD2, DATA_EVEN1, DATA_EVEN2).

Figure 3:
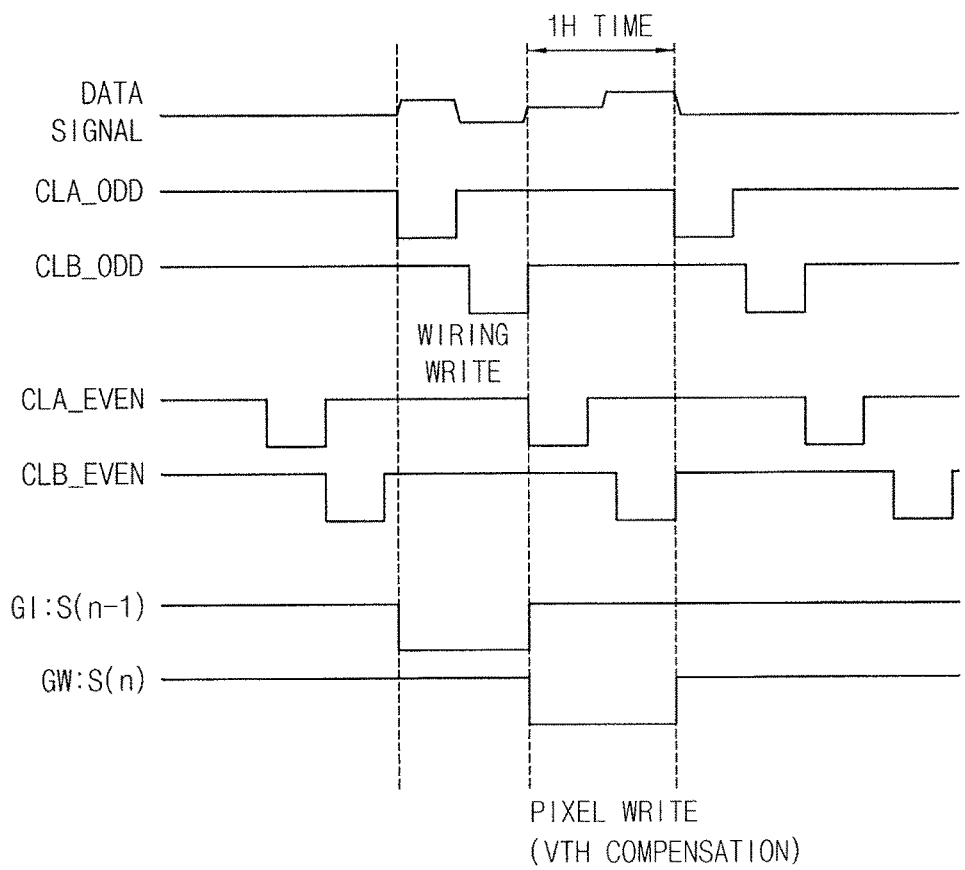
FIG. 3 illustrates an example of control signals for the pixels.

FIG. 3 is a timing diagram illustrating an example of control signals for the pixels in an OLED. Referring to FIG. 3, a data signal of a pixel (N) in an even-numbered column and a data signal of a pixel (N+1) in an odd-numbered column adjacent to the even-numbered column may be temporally separated.

If one data wiring were disposed to correspond to pixels in one column, an action to transport a data signal (data writing) and an action to compensate as a threshold voltage (compensation threshold voltage) may have to be performed in a given time. For example, in one pixel, after the action to transport a data signal (data writing) and the action to compensate as a threshold voltage (compensation threshold voltage) are completed, the same actions may be performed in a next pixel. Thus, as the resolution of the display increases, the time for performing these actions would decrease.

In accordance with one or more embodiments, two data wiring may be disposed to correspond to pixels in one column. Therefore, the data signal of a pixel in an odd-numbered row and the data signal of a pixel in an even-numbered row may be separated in time. As a result, the action to transport a data signal (data writing) and the action to compensate a threshold voltage (Vth compensation) may be performed at mutually separated times. For example, before an action to transport a data signal to a pixel in odd row (data writing) and an action to compensate a threshold voltage are completed, an action to transport a data signal to a pixel in even row (data writing) and an action to compensate a threshold voltage may be performed. Thus, the timing of the actions may at least partially overlap. Thus, the time for carrying out both the action to transport a data signal to each of pixels (data writing) and the action to compensate a threshold voltage may be increased, e.g., doubled.

Figure 4:
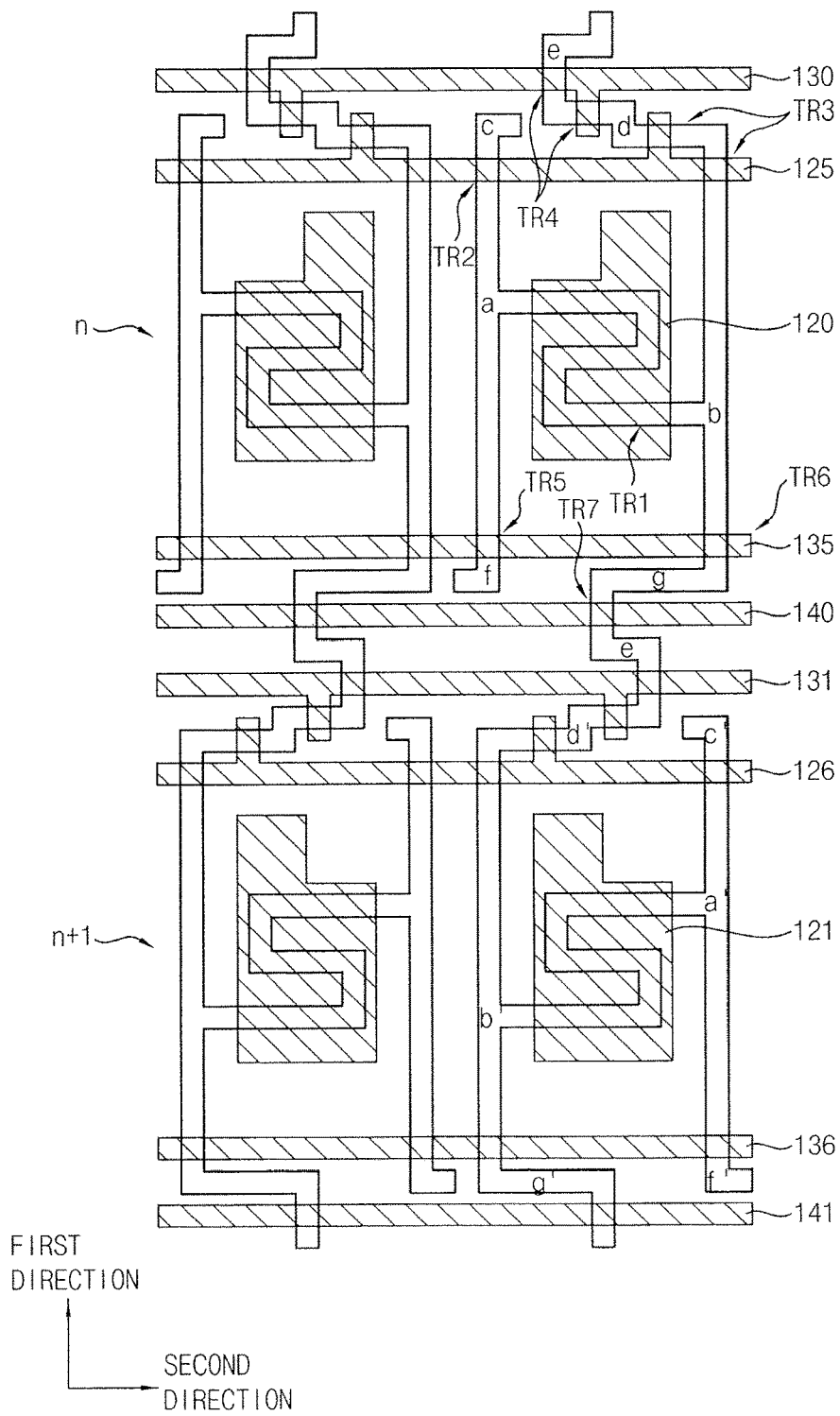
FIGS. 4 to 8 illustrate examples of layouts of pixels.

FIGS. 4 to 8 illustrate embodiments of layouts of the pixels. Referring to FIG. 4, one layout embodiment includes a substrate, an active pattern 110, a gate insulation layer, first gate electrodes 120 and 121, second gate electrodes 125 and 126, third gate electrodes 130 and 131, fourth gate electrodes 135, and 136 and fifth gate electrodes 140 and 141.

The substrate may include an insulative material, e.g., glass, transparent plastic, transparent metal oxide, etc. At least one of a buffer layer may be provided on the substrate. The buffer layer may include, for example, silicon oxide, silicon nitride, silicon oxynitride, etc.

The active pattern 110 is on the substrate and may include, for example, silicon. For example, the active pattern 110 may include a semiconductor oxide which contains a two-component compound (ABx), a three-component compound (ABxCy), a four-component compound (ABxCyDz), or the like, with indium, zinc, gallium, tin, titanium, aluminum, hafnium (Hf), zirconium (Zr) and magnesium (Mg), etc., used alone or in combination with each other.

The active pattern 110 may include first to seventh areas (a, b, c, d, e, f, g) at a part in which the pixel disposed. The first to seventh areas (a, b, c, d, e, f, g) may have an impurity, and thus the first to seventh areas (a, b, c, d, e, f, g) may have higher electrical conductivity than other areas of the active pattern 110. The first to seventh areas (a, b, c, d, e, f, g) may correspond, for example, to the source electrode or drain electrode of the first to seventh transistors (TR1, TR2, TR3, TR4, TR5, TR6, TR7).

In some example embodiments, a part of the active pattern 110 corresponding to a pixel (N) in an even-numbered row may have a symmetrical shape with a part of active pattern 110 corresponding to a pixel (N+1) in odd-numbered row with respect to an axis extending in the first direction. For example, the active pattern 110 of the pixel (N) in the even-numbered row and an active pattern 110 of the pixel (N+1) in the odd-numbered row may have symmetrical shape relative to each other. Therefore, the first to seventh areas (a, b, c, d, e, f, g) of the active pattern 110 corresponding to the pixel (N) in an even-numbered row may be symmetrical to the first to seventh areas (a', b', c', d', e', f', g') of the active pattern 110 corresponding to the pixel (N+1) in an odd-numbered row.

A gate insulation layer may cover the active pattern 110 on the substrate. The gate insulation layer may include, for example, a silicon compound and a metal oxide. In one embodiment, the gate insulation layer may include one or more of silicon oxide, silicon nitride, silicon oxynitride, aluminum oxide, tantalum oxide, hafnium oxide, zirconium oxide, titanium oxide, etc. For example, the gate insulation layer may have a multilayer structure including a silicon oxide layer and silicon nitride.

First gate electrodes 120 and 121, second gate electrodes 125 and 126, third gate electrodes 130 and 131, fourth gate electrodes 135 and 136, and fifth gate electrodes 140 and 141 may be on the gate insulation layer. The first gate electrodes 120 and 121, the second gate electrodes 125 and 126, the third gate electrodes 130 and 131, the fourth gate electrodes 135 and 136, and the fifth gate electrodes 140 and 141 may include a metal, alloy, metal nitride, conductive metal oxide, transparent conductive material, etc. For example, the gate electrodes 120, 121, 125, 126, 130, 131, 135, 136, 140, and 141 may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), an alloy thereof, or conductive nitride. In another embodiment, gate electrodes 120, 121, 125, 126, 130, 131, 135, 136, 140, and 141 may include a strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc.

In another embodiment, gate electrodes 120, 125, 130, 135, and 140 of a part corresponding to the pixel (N) in an even-numbered row may have a symmetric shape with gate electrodes 121, 126, 131, 136, and 141 of an part corresponding to the pixel (N+1) in an odd-numbered row.

A first gate electrode 120 may be in the first transistor (TR1) with a first area (a) and a second area (b). The first area (a) may be a source area and the second area (b) may be a drain area, or vice versa. In one embodiment, an area under the first gate electrode 120 for the active pattern 110 may not have a dopant. Therefore, the first area (a) and the second area (b) may operate as a conductor, and the area under the first gate electrode 120 for the active pattern 110 may operate as a channel of the first transistor (TR1). The first transistor (TR1) may therefore generate a driving current (ID) to be supplied to the organic light emitting diode (OLED) in FIG. 1, and the organic light emitting diode emits light based on the driving current (ID).

The second gate electrode 125 may be in the second transistor (TR2) with a first area (a) and a third area (c). The first area (a) may be a source area and the third area (c) may be a drain area, or vice versa. The second gate electrode 125 may be in a third transistor (TR3) with a second area (b) and a fourth area (d). The second area (b) may be a source area and the fourth area (d) may be a drain area, or vice versa.

In one embodiment, an area under the second gate electrode 125 for the active pattern 110 may not have a dopant. Therefore, the first area (a), the second area (b), the third area (c), and fourth area (d) may operate as a conductor. The areas under a second gate electrode 125 for the active pattern 110 may operate as a channel of the second transistor (TR2) and the third transistor (TR3), respectively. The second transistor (TR2) may be supplied, for example, with a scan signal (GW) of a current stage in FIG. 1.

The third gate electrode 130 may be in the fourth transistor (TR4) with a fourth area (d) and a fifth area (e). The fourth area (d) may be a source area and the fifth area (e) may be a drain area, or vice versa. In one embodiment, an area under the third gate electrode 130 for the active pattern 110 may not have a dopant. Therefore, both the fourth area (d) and the fifth area (e) may operate as a conductor. The areas under the third gate electrode 130 for the active pattern 110 may operate as a channel of the fourth transistor (TR4). The third gate electrode 130 may be supplied, for example, with a gate initial signal (GI) in FIG. 1.

The fourth gate electrode 135 may be in the fifth transistor (TR5) with a first area (a) and a sixth area (f). The first area (a) may be a source area and the sixth area (f) may be a drain area, or vice versa. The fourth gate electrode 135 may be in a sixth transistor (TR6) with a second area (b) and a seventh area (g). The second area (b) may be a source area and the seventh area (g) may be a drain area, or vice versa.

In one embodiment, an area under the fourth gate electrode 135 for the active pattern 110 may not have a dopant. Therefore, the first area (a), the second area (b), the sixth area (f), and the seventh area (g) may operate as a conductor. The areas under the fourth gate electrode 135 for the active pattern 110 may operate as a channel of the fifth transistor (TR5) and the sixth transistor (TR6), respectively. The fourth gate electrode 135 may be supplied, for example, with a light emitting signal (EM) in FIG. 1.

The fifth gate electrode 140 may be in the seventh transistor (TR7) with a fifth area (e) and a seventh area (g). The fifth area (e) may be a source area and the seventh area (g) may be a drain area, or vice versa. In one embodiment, an area under the fifth gate electrode 140 for the active pattern 110 may not have an impurity. Therefore, both the fifth area (e) and seventh area (g) may operate as a conductor. The areas under the fifth gate electrode 140 for the active pattern 110 may operate as a channel of the seventh transistor (TR7). The fifth gate electrode 140 may be supplied, for example, with a gate initial signal (GI) in FIG. 1, and the fifth area (3) may be supplied, for example, with an internal voltage (VINT) in FIG. 1.

Figure 5:
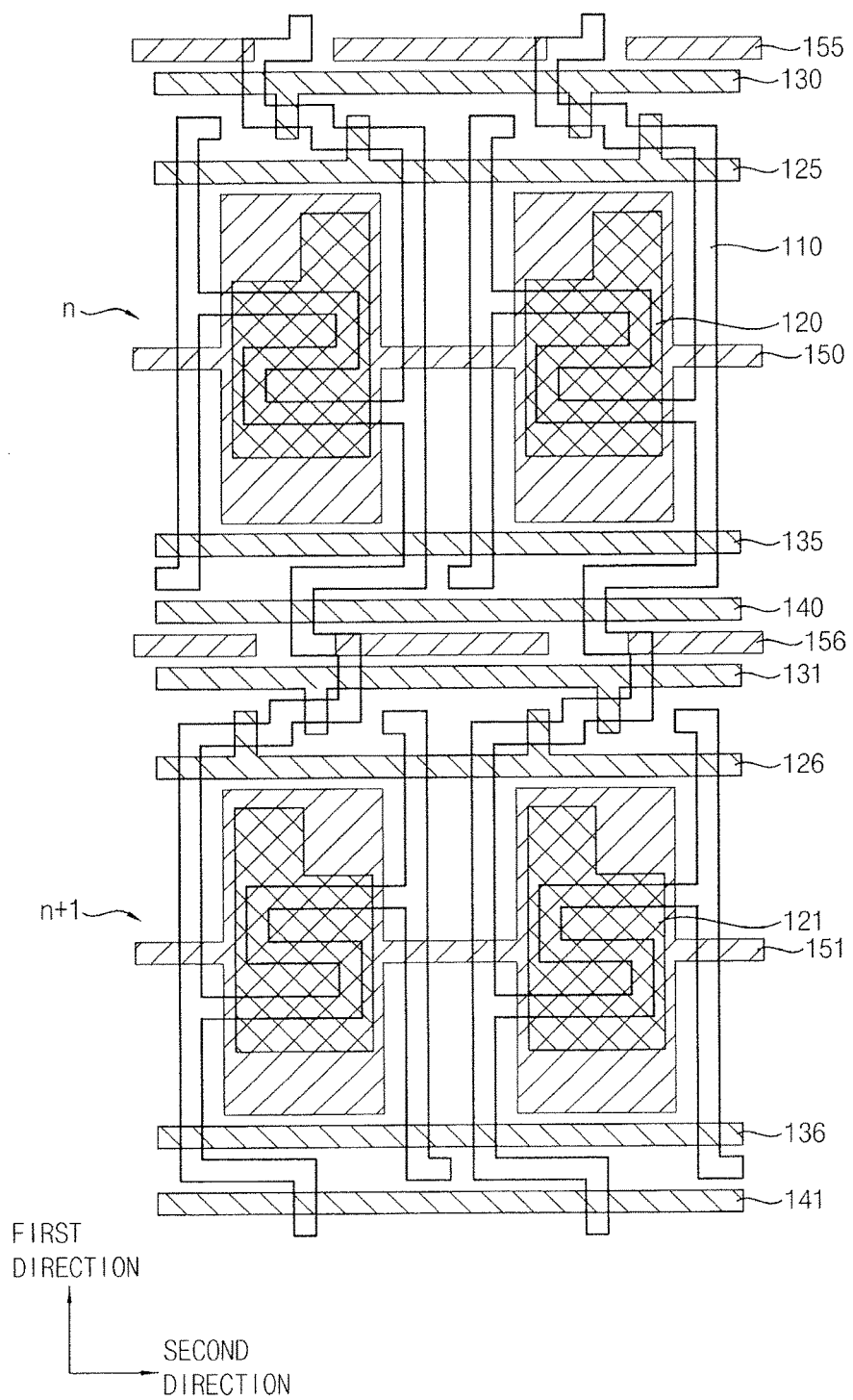

Referring to FIG. 5, another layout embodiment includes a substrate, the active pattern 110, a gate insulation layer, and the gate electrodes 120, 121, 125, 126, 130, 131, 135, 136, 140, and 141. This embodiment may also include a first insulating interlayer covering the gate electrodes 120, 121, 125, 126, 130, 131, 135, 136, 140, and 141, first conductive patterns 150 and 151 on the first insulating interlayer, second conductive patterns 155 and 156 on the first insulating interlayer, and a second insulating interlayer covering the first conductive patterns 150 and 151 and the second conductive patterns 155 and 156.

The first insulating interlayer may cover first gate electrodes 120 and 121, second gate electrodes 125 and 126, third gate electrodes 130 and 131, fourth gate electrodes 135 and 136, and fifth gate electrodes 140 and 141. The first insulating interlayer may be on the gate insulation layer. The first insulating interlayer may include an organic material such as silicon compound, or an inorganic insulative material such as a transparent insulating resin. For example, the first insulating interlayer may be formed of a silicon oxide, silicon nitride, silicon oxynitride, etc. These may be used alone or in combination.

The first conductive patterns 150 and 151 may overlap the first gate electrodes 120 and 121. Therefore, each of the first conductive patterns 150 and 151 may be in a storage capacitor (CST) in FIG. 1 with the first gate electrodes 120 and 121. In another embodiment, each of the first conductive patterns 150 and 151 may have a shape extending in the second direction. The first conductive patterns 150 and 151 may be supplied, for example, with the first power supply voltage (ELVDD) in FIG. 1.

The second conductive patterns 155 and 156 may partially overlap a fifth area (e) of the active pattern 110. Each of the second conductive patterns 155 and 156 may extend in the second direction and may be disposed apart from each other along the second direction. The second conductive patterns 155, 156 may be supplied, for example, with the internal voltage (VINT) in FIG. 1 and may supply the internal voltage (VINT) to the fifth area (e) through a contact.

Figure 6:
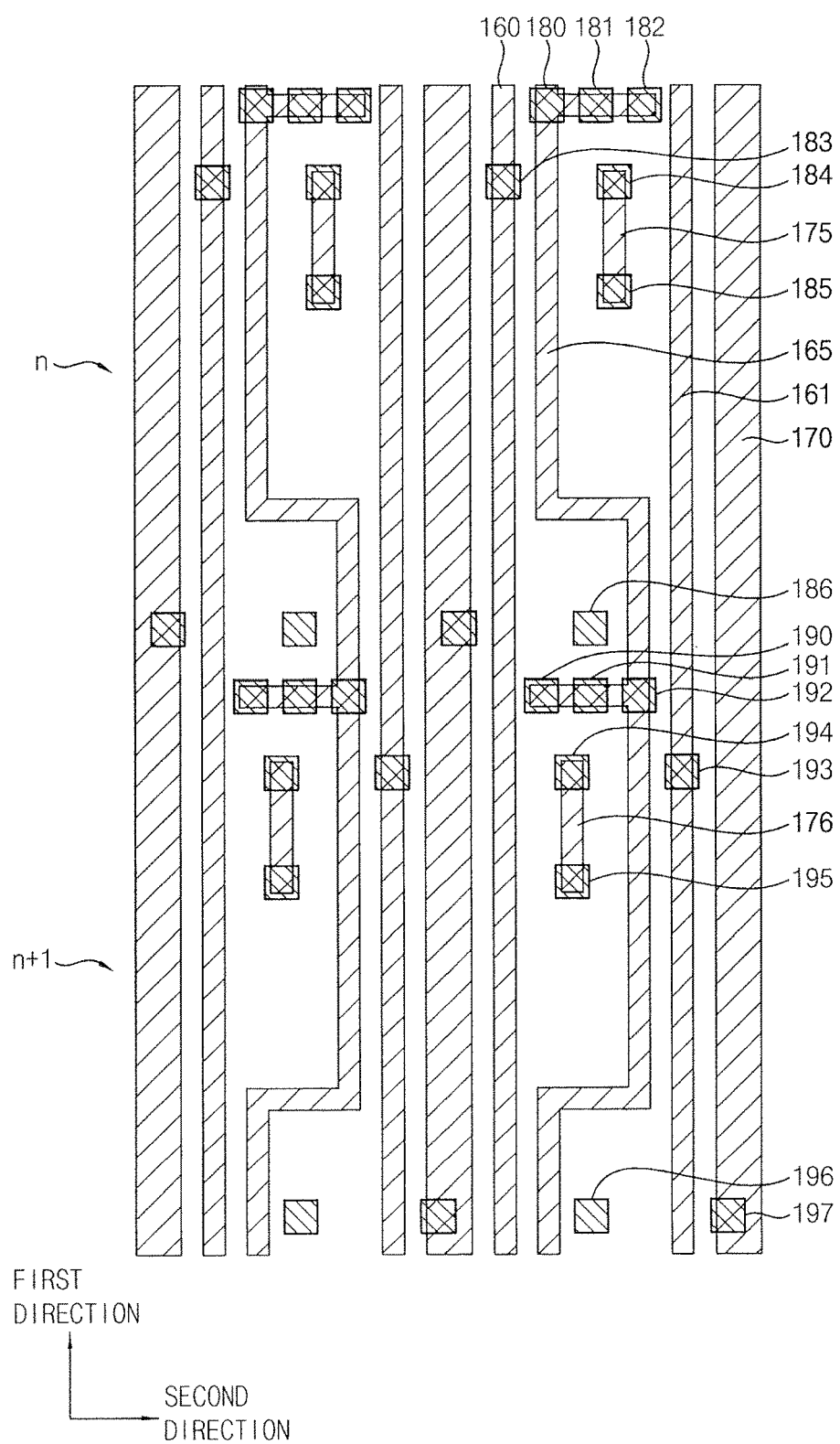
Figure 7:
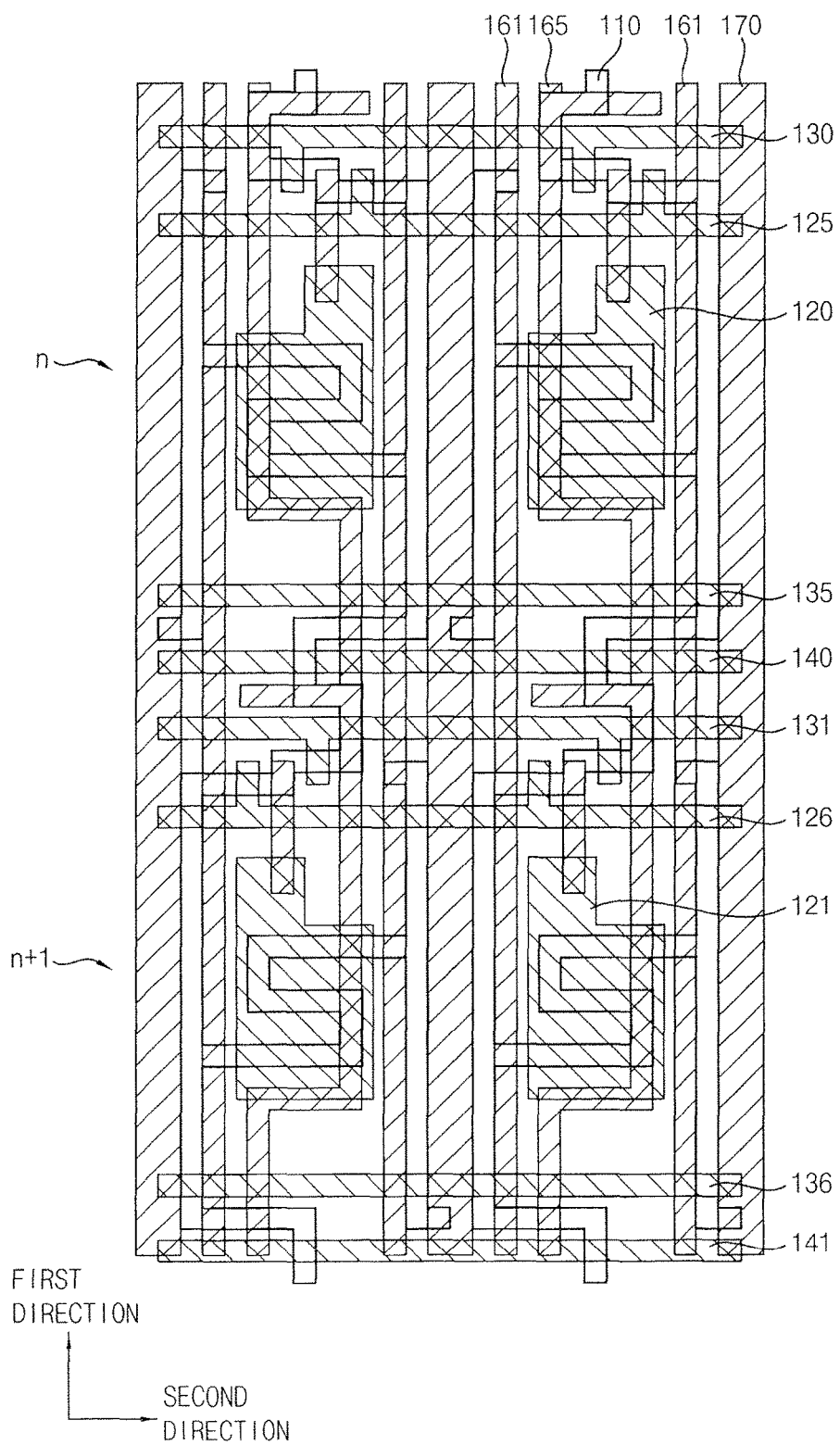

Referring to FIGS. 6 and 7, wirings 160, 161, 165, and 170 and connecting patterns 175 and 176 may be disposed on the second insulating interlayer. For convenience, wirings 160, 161, 165, and 170, connecting patterns 175 and 176 and contacts 180, 181, 182, 183, 184, 185, 186, 190, 191, 192, 193, 194, 195, 196, and 197 are only shown in FIG. 6.

A first data wiring 160, a second data wiring 161, a first power supply wiring 165, a second power supply wiring 170 and first connecting patterns 175 and 176 may include metal, alloy, metal nitride, conductive metal oxide, a transparent conductive material, etc. These may be used alone or in combination.

The first data wiring 160 and the second data wiring 161 may extend in the first direction and may be separated from each other along the second direction. The first data wiring 160 and the second data wiring 161 may correspond to pixels in one column. In one embodiment, the first data wiring 160 may be electrically connected to a third area (c; referring to FIG. 4) of the active pattern 110 under a pixel (N) in even-numbered column, through a fourth contact 183. In another embodiment, the second data wiring 161 may be connected to a third area (c'; referring to FIG. 4) of an active pattern 110 under a pixel (N+1) in odd-numbered column, through an eleventh contact 183.

In one embodiment, the first data wiring 160 may be supplied an even-numbered data signal (DATA_EVEN), and the second data wiring 161 may be supplied an odd-numbered data signal (DATA_ODD) in FIG. 1. Therefore, the pixel (N) in even-numbered row and the pixel (N+1) in odd-numbered row may be supplied mutually different signals.

A first power supply wiring 165 may extend in the first direction and may be between the first data wiring 160 and the second data wiring 161. Therefore, the first data wiring 160 and the second data wiring 161 may be apart from each other along the second direction, and therefore it is possible to prevent a coupling phenomenon.

The first power supply wiring 165 may be supplied an internal voltage (VINT) in FIG. 1. The first power supply wiring 165 may be connected to the second conductive pattern 155 (referring to FIG. 5) apart in the second direction through a first contact 180 and a third contact 183. The first power supply wiring 165 may be connected to second conductive patterns 156 (referring to FIG. 5) apart in the second direction through a eighth contact 190 and a tenth contact 192. In another embodiment, the first power supply wiring 165 may be connected to fifth areas (e, e'; referring to FIG. 4) of an active pattern 110 through a second contact 181 and a ninth contact 191.

A second power supply wiring 170 may extend in the first direction and overlap a boundary of pixels. In one embodiment, the second power supply wiring 170 may be connected to a sixth area (f; referring to FIG. 4) of the active pattern 110 through a sixteenth contact 197. As a result, the second power supply wiring 170 may supply a first power supply voltage (ELVDD) to a sixth area (f) of the active pattern 110.

In another embodiment, first connecting patterns 175 and 176 may extend in the first direction and may be electrically connected to the active pattern 110 through a fifth contact 184 or a twelfth contact 194. The first connecting patterns 175 and 176 may be electrically connected to first gate electrodes 120 and 121 through a sixth contact 182 and a thirteenth contact 195. As a result, the first connecting patterns 175 and 176 may connect the gate electrodes 120 and 121 and fourth areas (d, d'; referring to FIG. 4) of the active pattern 110.

Figure 8:
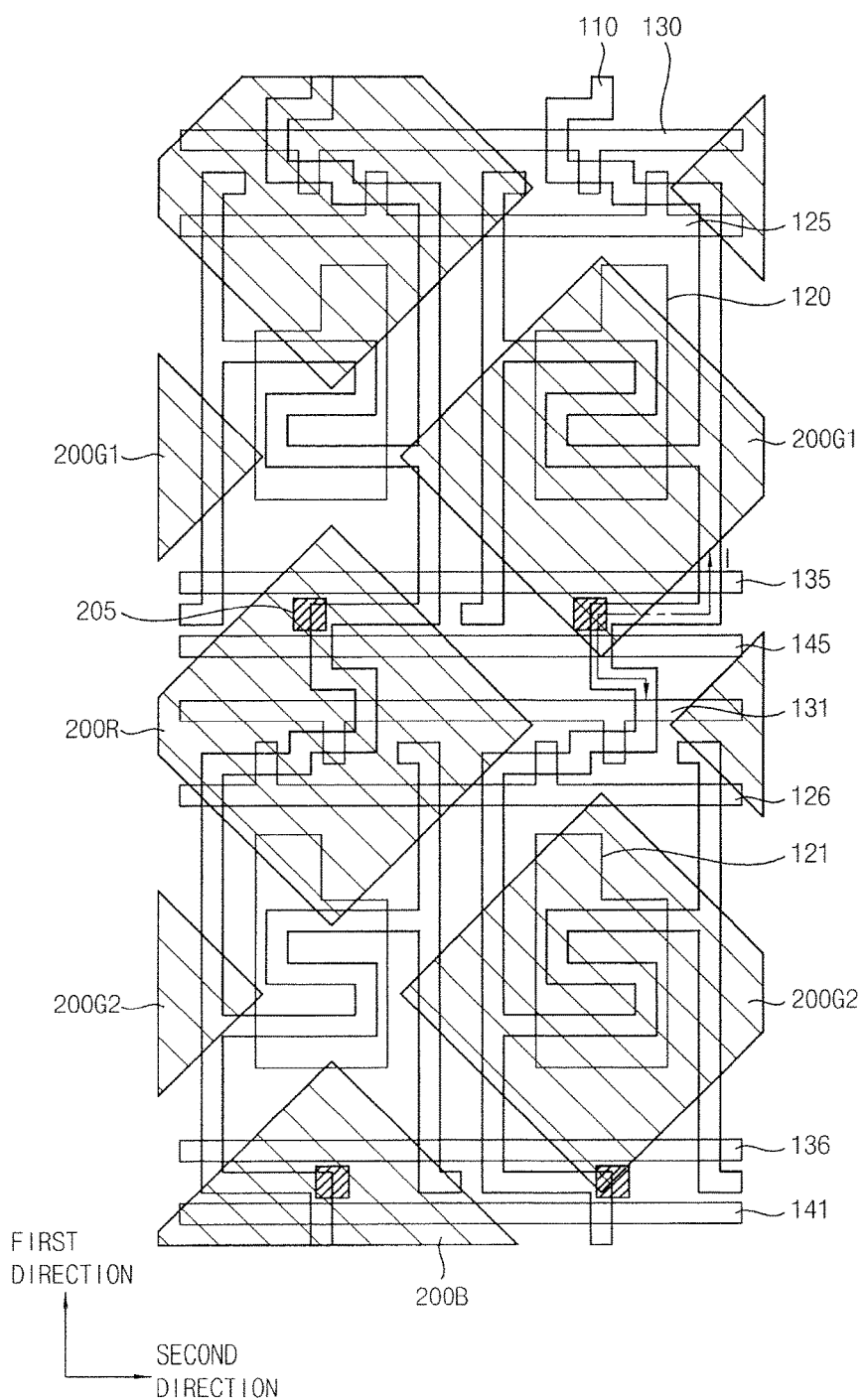

Referring to FIG. 8, a third insulating interlayer cover both wirings 160, 161, 165, and 170 and first connecting patterns 175 and 176, and pixel electrodes 200G1, 200G2, 200R, and 200B are on the third insulating interlayer. In one embodiment, the pixel electrodes 200G1, 200G2, 200R, and 200B may have a diamond shape including sides extending the first direction and the second direction. The electrodes 200G1, 200G2, 200R, and 200B may have a different shape in another embodiment.

In one embodiment, the pixel electrodes 200G1, 200G2, 200R, and 200B may be arranged in pentile form. For example, the pixel electrodes 200G1, 200G2, 200R, and 200B may be arranged along the first direction and the second direction and may be staggered relative to each other. For example, in a first column, a pixel electrode 200R of a red pixel and a pixel electrode 200B of a blue pixel may alternately repeat along the first direction. In a second column, pixel electrodes 200G1 and 200G2 of a green pixel may alternately repeat. The pixel electrodes 200G1, 200G2, 200R, and 200B may be connected to a seventh area (g) of the active pattern through an electrode contact 205.

Figure 9:
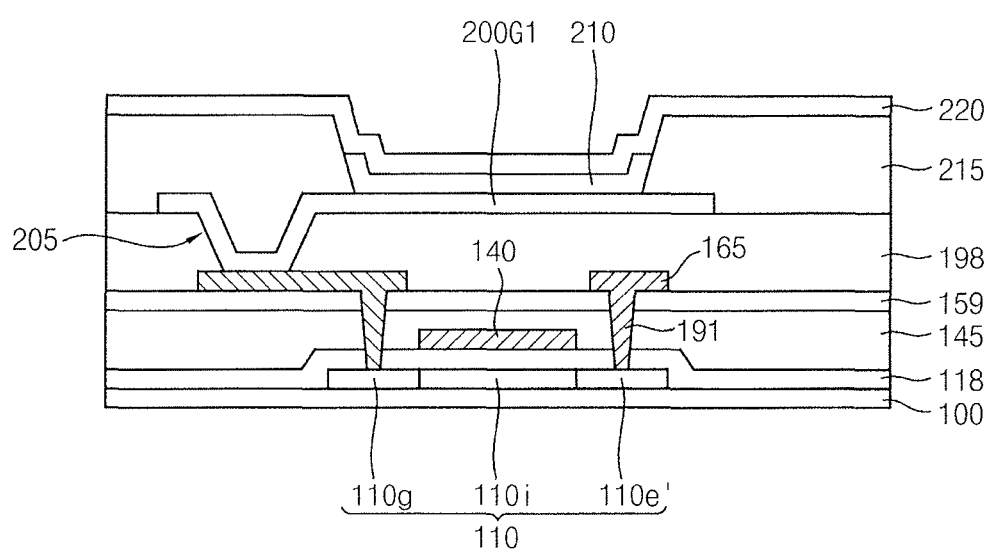
FIG. 9 illustrates a cross-sectional view of a transistor in FIG. 8.

FIG. 9 illustrates a cross-sectional view illustrating an embodiment of the seventh transistor in FIG. 8. Referring to FIG. 9, this embodiment includes the active pattern 110, a gate insulating layer 118, a fifth gate electrode 140, a first insulating interlayer 145, a second insulating interlayer 159, a seventh contact 186, a ninth contact 191, a first power supply wiring 165, a third insulating interlayer 198, an electrode contact 205, a pixel electrode 200G1, an organic light emitting layer 210, a pixel defined layer 215, and a common electrode 220 on a substrate 100.

The pixel defined layer 215 may be on the third insulating interlayer 198. For example, the pixel defined layer 215 may be on the third insulating interlayer 198 and a portion of the pixel electrode 200G1. The pixel defined layer 215 may have an opening on some part of the pixel electrode 200G1 on the third insulating interlayer 198, and the organic light emitting layer 210 may be disposed on the opening. The organic light emitting layer 210 may be on the pixel electrode 200G1. For example, the organic light emitting layer 210 may be on the pixel electrode 200G1 exposed through the opening of the pixel defined layer 215. The organic light emitting layer 210 may include a light emitting material which, for example, may include an organic material. The organic material may emit light of a wavelength that corresponds to red light, green light, and/or blue light.

The common electrode 220 may be on the pixel defined layer 215 and the organic light emitting layer 210. In one embodiment, the common electrode 220 may include a transparent conductive material. For example, the common electrode 220 may include indium a tin oxide, an indium zinc oxide, a zinc oxide, a tin oxide, a gallium oxide, an indium oxide, etc. In one embodiment, the common electrode 220 may be a cathode electrode, e.g., the common electrode 220 may be in an organic light emitting diode (OLED) in FIG. 1 and an organic light emitting layer and a pixel electrode 200G1 may correspond to the common electrode 220. In one embodiment, the common electrode 220 may be an anode electrode. The common electrode 220 may be supplied with a second power supply voltage (ELVSS).

Thus, the embodiments in FIGS. 1 to 9 may include a first data wiring 160 and a second data wiring 161 corresponding to one pixel column at the same time. Since the first data wiring 160 and the second data wiring 161 are apart each other by a first power supply wiring 165, a coupling phenomenon between the first data wiring 160 and the second data wiring 161 may be reduced or prevented.

Figure 10:
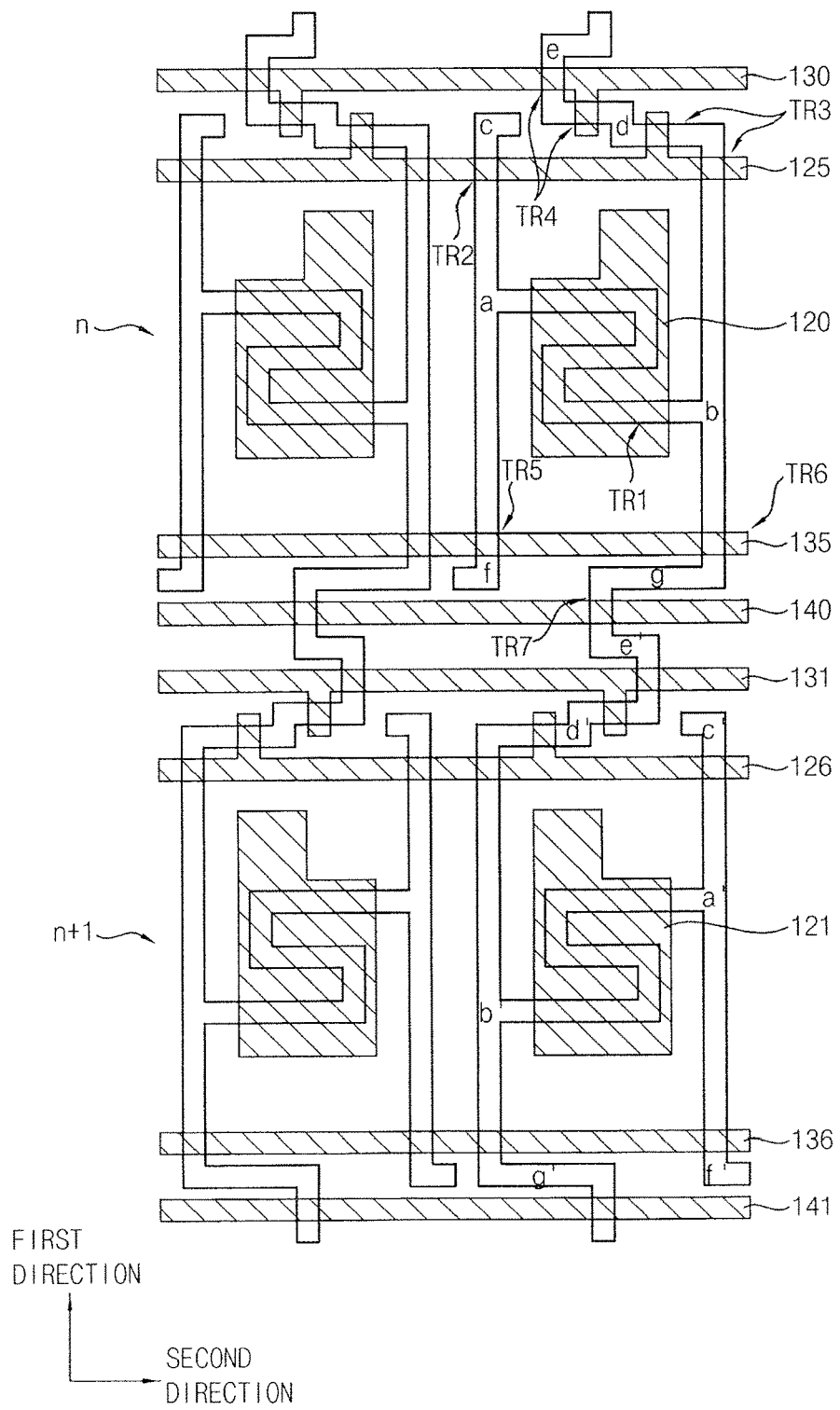
FIGS. 10 to 14 illustrate additional examples of layouts of pixels.

FIGS. 10 to 14 illustrate top plan views of various layout embodiments of pixels. Referring to FIG. 10, one embodiment includes a substrate, the active pattern 110, a gate insulating layer, first gate electrodes 120 and 121, second gate electrode 125 and 126, third gate electrode 130 and 131, fourth gate electrode 135 and 136, and fifth gate electrode 140 and 141. The active pattern 110 and the gate electrodes 120, 121, 125, 126, 130, 131, 135, 136, 140, and 141 may be similar to FIG. 4.

In one embodiment, a first insulating interlayer may be on a gate insulating layer and may cover gate electrodes 120, 121, 125, 126, 130, 131, 135, 136, 140, and 141. The first conductive patterns 150 and 151 and second conductive patterns 155 and 156, which are described with reference to FIG. 5, may be on the first insulating interlayer, and a second insulating interlayer may be disposed to cover those.

Figure 11:
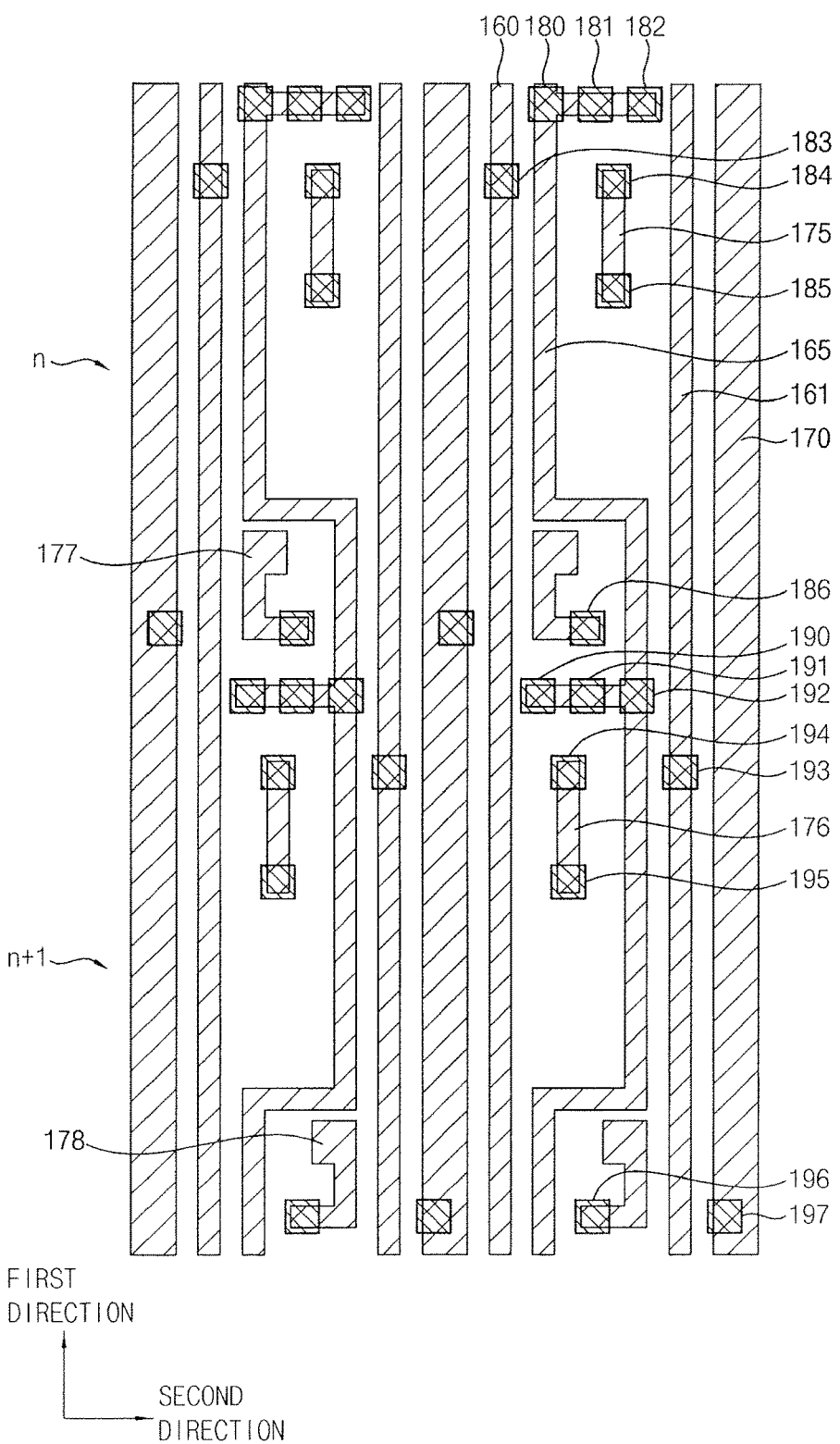
Figure 12:
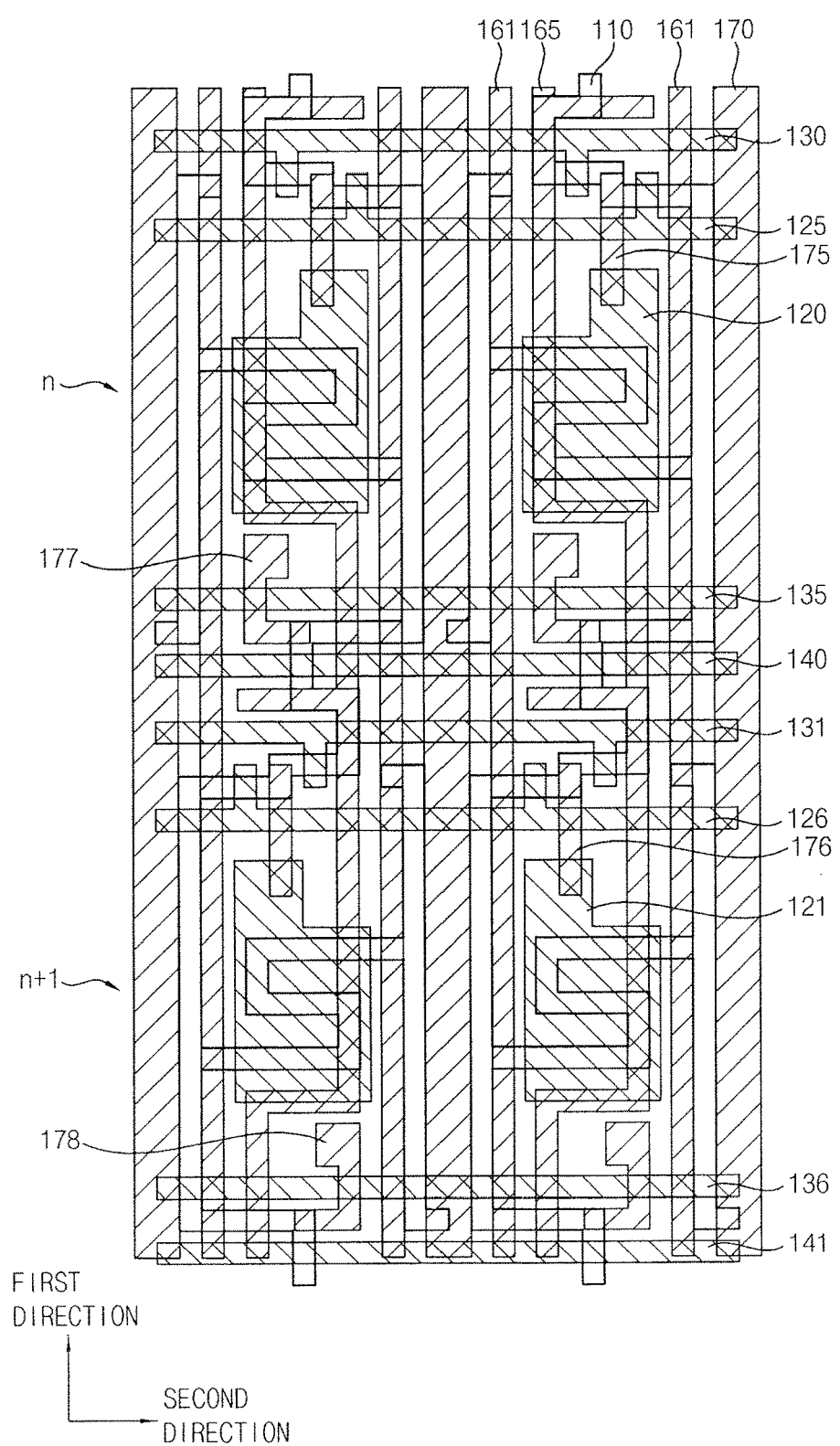

Referring to FIGS. 11 and 12, wirings 160, 161, 165, and 170, first connecting patterns 175 and 176, and second connecting patterns 177 and 178 may be on the second insulating interlayer. For convenience of description, contacts, wirings 160, 161, 165, and 170, first connecting patterns 175 and 176, and second connecting patterns 177 and 178 may be only shown in FIG. 6. The wirings 160, 161, 165, and 170 and first connecting patterns 175 and 176 may be similar to those in FIGS. 6 and 7.

The second connecting patterns 177 and 178 may be between a first data wiring 160 and a first power supply wiring 165, or between a second data wiring 161 and a first power supply wiring 165. In one embodiment, second connecting patterns 177 and 178 may partially overlap a seventh area (g, g'; referring to FIG. 10) of the active pattern 110. The second connecting patterns 177 and 178 may be connected to a seventh area (g, g'; referring to FIG. 10) of the active pattern 110 through a seventh contact 186.

Figure 13:
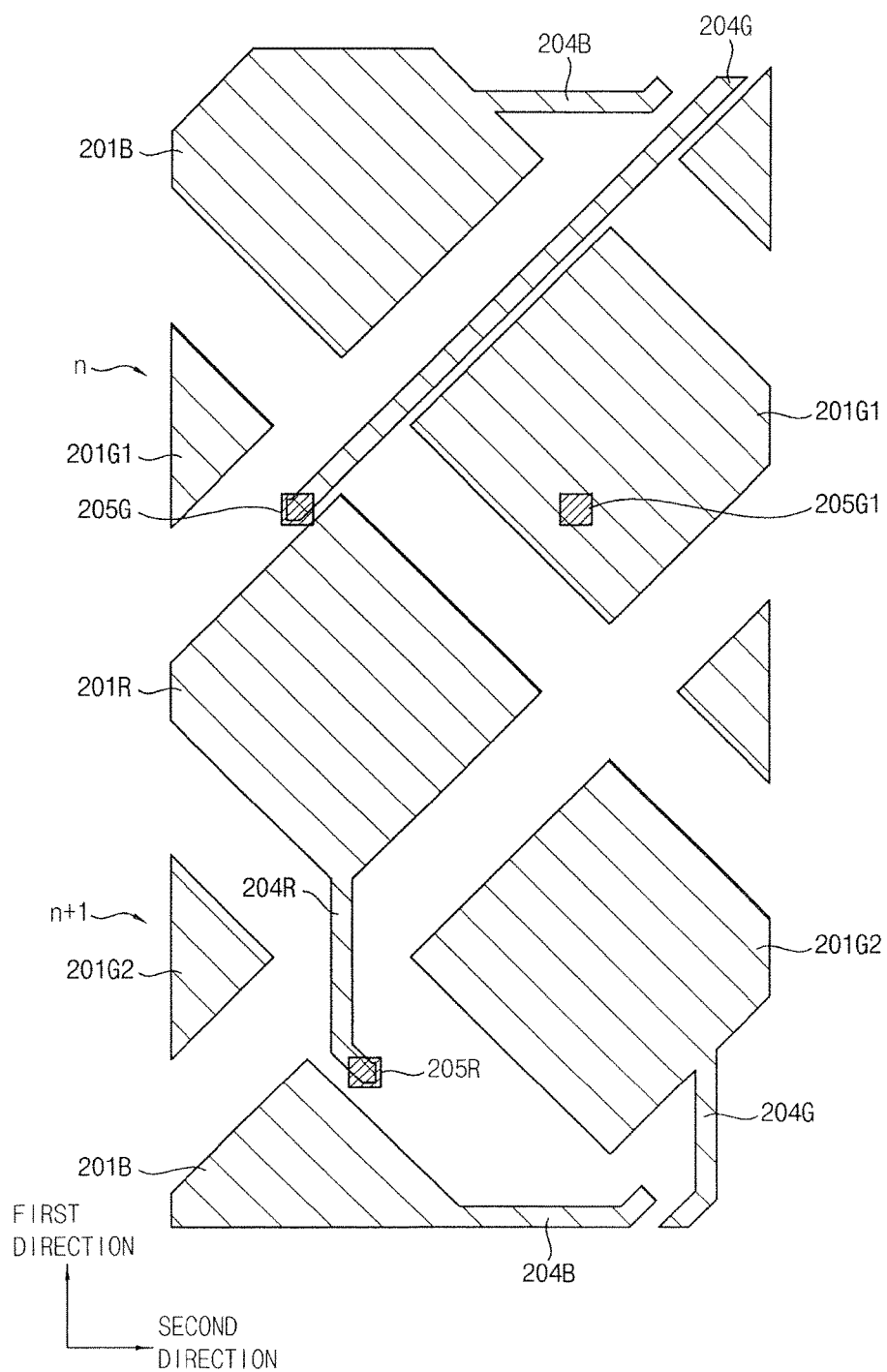
Figure 14:
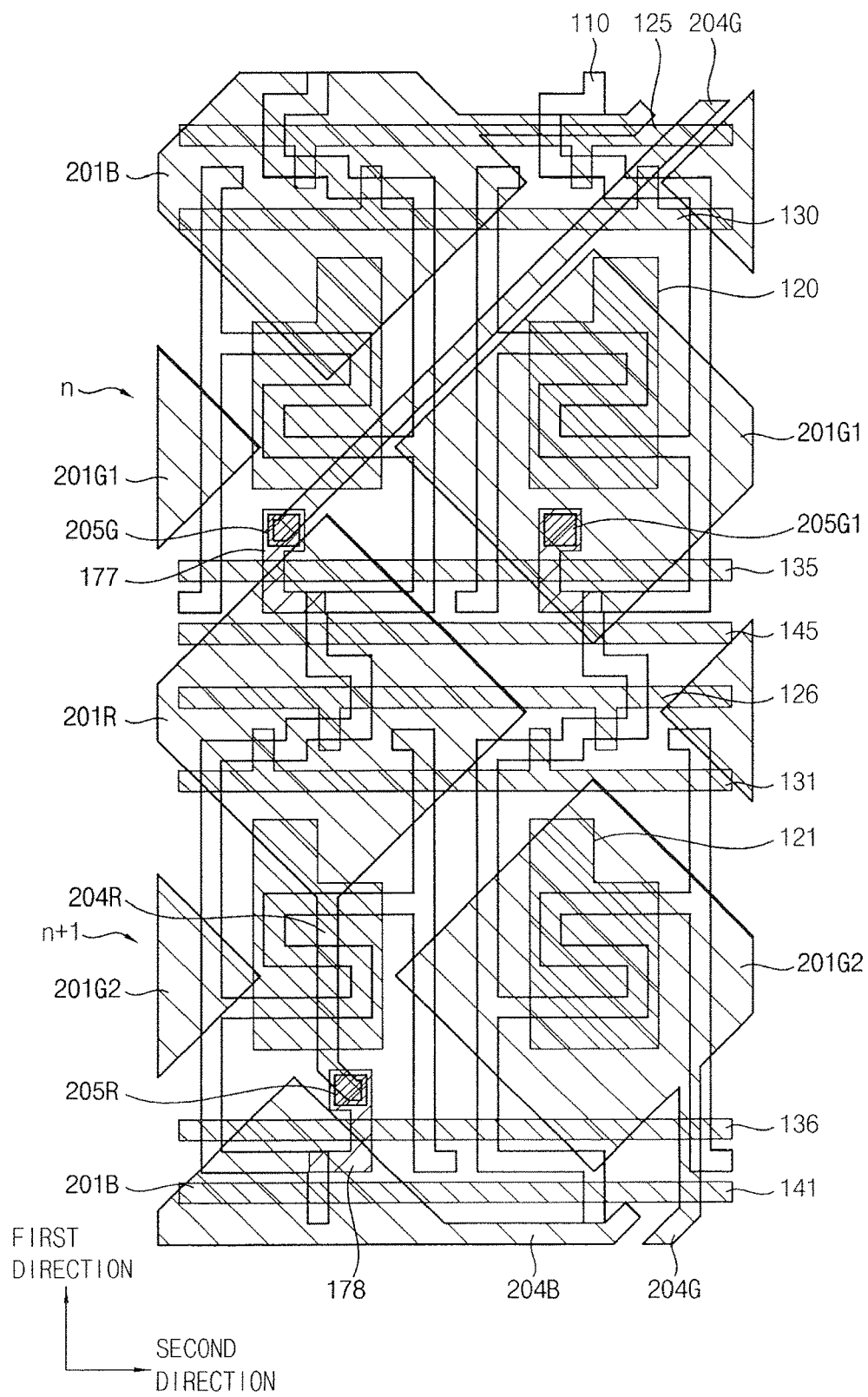

Referring to FIGS. 13 and 14, additional embodiments include wirings 160, 161, 165, and 170 (referring to FIG. 12), a third insulating interlayer covering connecting patterns 175, 176, 177, and 178 (referring to FIG. 12), and pixel electrodes 201G1, 201G2, 201R, and 201B on the third insulating interlayer. The pixel electrodes 201G1, 201G2, 201R, and 201B may include metal, alloy, metal nitride, conductive metal oxide, a transparent conductive material, etc. These may be used alone or combination.

The pixel electrodes 201G1, 201G2, 201R, and 201B may have a diamond shape including sides extending in the first direction and the second direction. The electrodes 201G1, 201G2, 201R, and 201B may have a different shape in another embodiment.

In one embodiment, pixel electrodes 201G1, 201G2, 201R, and 201B may be arranged in pentile form. For example, in a first column, a pixel electrode 201R of a red pixel and a pixel electrode 201B of a blue pixel may be alternately repeated in the first direction. In a second column, an even-numbered pixel electrode 201G1 of a green pixel and an odd-numbered pixel electrode 201G2 of a green pixel may alternately repeat.

In one embodiment, some pixel electrodes 201G1, 201G2, 201R, and 201B may be connected to connecting portions 204R, 204G, and 204B extending from the diamond shape. One or more of the pixel electrodes 201G1, 201G2, 201R, and 201B and connecting portion 204R, 204G, and 204B may include the same material and/or the same thickness. One or more of the pixel electrodes 201G1, 201G2, 201R, and 201B may be integral with connecting portions 204R, 204G, and 204B.

In one embodiment, one or more of the pixel electrodes 201G1, 201G2, 201R, and 201B may be connected to a seventh area (g, g'; referring to FIG. 10) through second connecting patterns 177 and 178, connecting portion 204R, 204G, and 204B, and/or electrode contacts 205R, 205G, and 205B.

In one embodiment, pixel electrodes 201G1 and 201G2 of a green pixel may be connected to a seventh area (g) of the active pattern 110 in the pixel (N) of even-numbered row. Pixel electrodes 201R and 201B of a red pixel and a blue pixel may be connected to a seventh area (g') of the active pattern 110 in the pixel (N+1) of odd-numbered row. For example, a first pixel electrode 201R may be connected to a corresponding a pixel in the odd row of even-numbered pixel column, a second pixel electrode 201B may be connected to a corresponding a pixel in the odd row of odd-numbered pixel column, a third pixel electrode 201G1 may be connected to a corresponding pixel in the even row of even-numbered pixel column, and a fourth pixel electrode 201G2 may be connected to a corresponding pixel in the odd row of even-numbered pixel column.

In one embodiment, pixel electrodes 201G1 and 201G2 of a green pixel may be connected to a seventh area (g') of the active pattern 110 in a pixel (N+1) of odd-numbered row. Electrodes 201R and 201B of a red pixel and a blue pixel may be connected to a seventh area (g) of the active pattern 110 in a pixel (N) of an even-numbered row.

As previously mentioned, the active pattern 110 of a pixel (N) in an even-numbered row and the active pattern 110 of a pixel (N+1) in odd-numbered row may be symmetrical. For example, a planar shape of a channel in the first transistor (TR1) which overlaps first gate electrodes 120 and 121 may be different from each other in even-numbered (N) row and odd-numbered (N+1) row. Therefore, if misalignment occurs in a process of manufacturing the display, first transistor (TR1) in an even-numbered (N) row and first transistor (TR1) in an odd-numbered (N+1) row may have different electrical properties, e.g., uniformity and dispersion of a threshold voltage (Vth) may be varied.

If each of pixel electrodes 201G1 and 201G2 in green pixels were connected to a pixel (N) in even row and a pixel (N+1) in odd row, due to an electrical property difference between a pixel circuit of even (N) row and a pixel circuit of odd (N+1) row, light emitted by adjacent green pixels may be different each other. Therefore, image quality of the OLED may be degraded.

In accordance with one or more embodiments, second connecting patterns 177 and 178 and connecting portions 204R, 204G, and 204B are included and pixel electrodes 201G1 and 201G2 of green pixels may be connected to a pixel circuit in the same row. Therefore, image quality may be improved.

Figure 15:
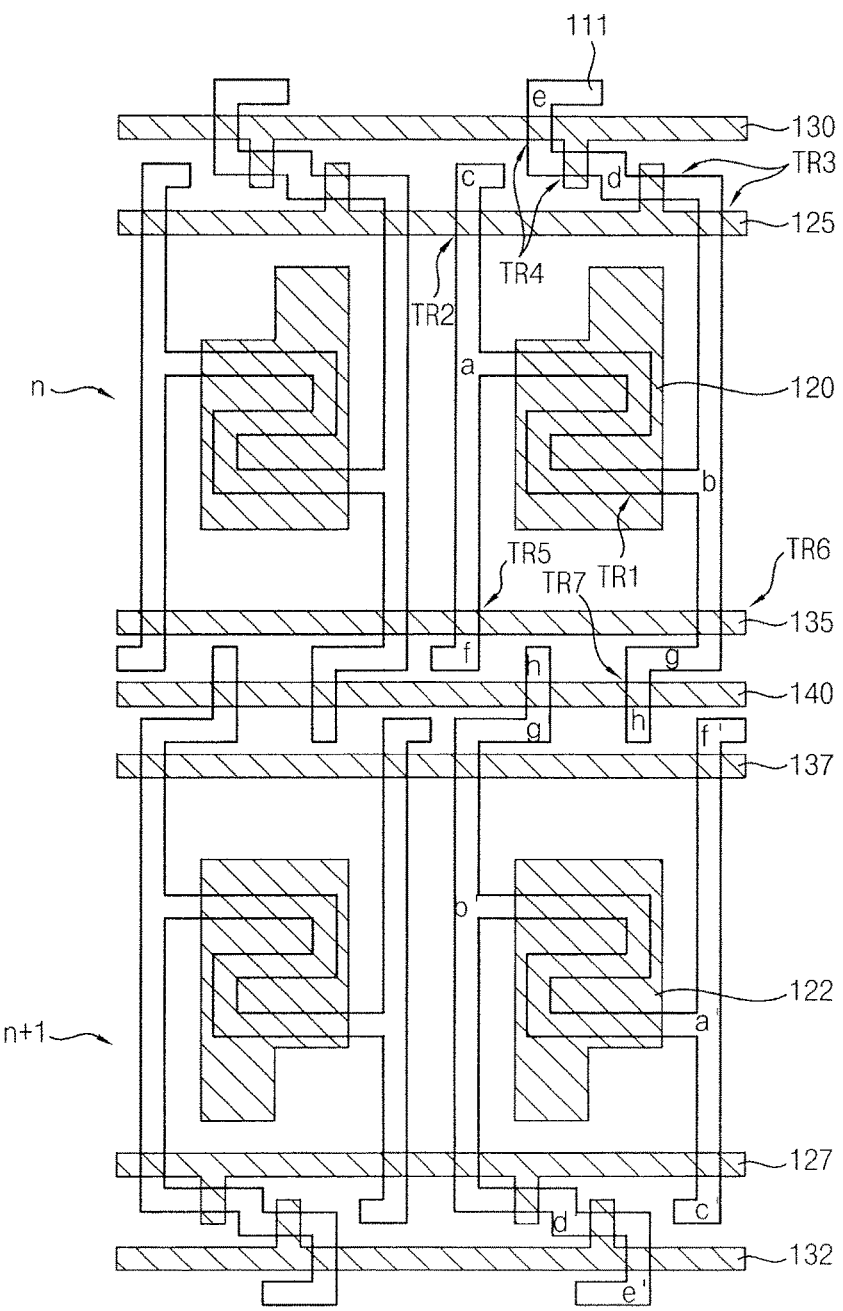
FIGS. 15 to 17 illustrate additional examples of layouts of pixels.
Figure 16:
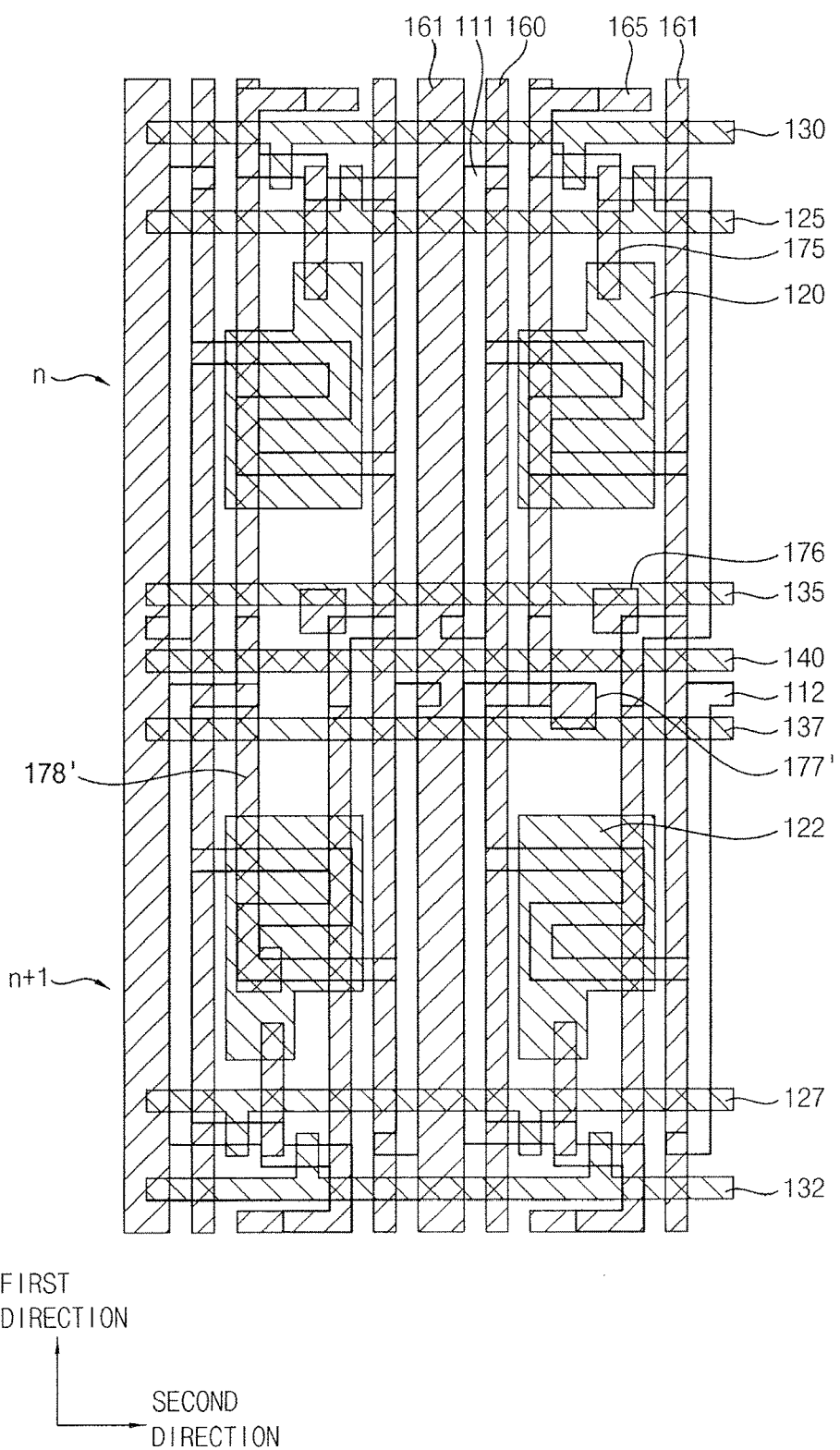
Figure 17:
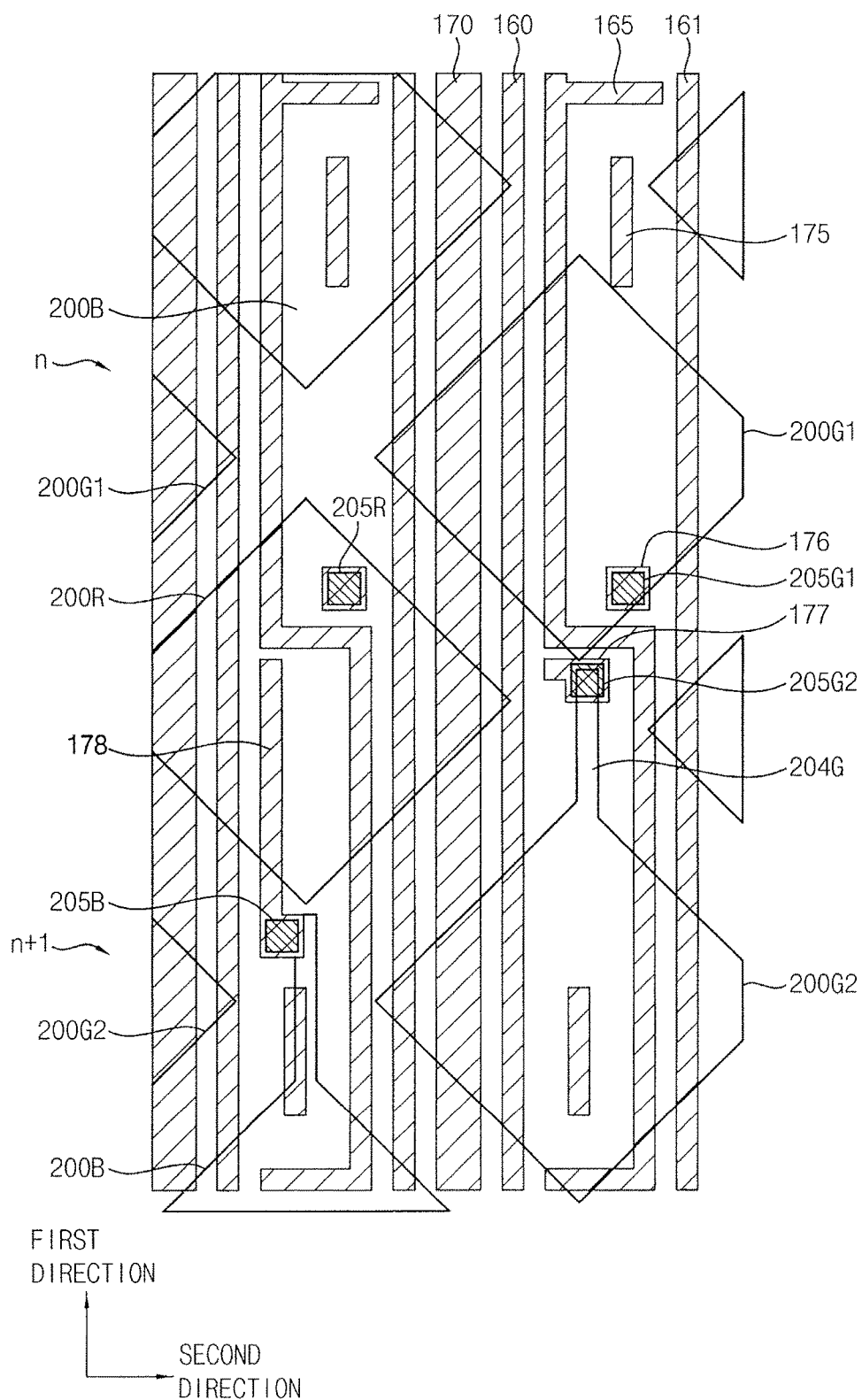

FIGS. 15 to 17 illustrate top plan views of additional layout embodiments of pixels. Referring to FIG. 15, one embodiment includes a substrate, active patterns 111 and 112, first gate electrodes 120 and 122, second gate electrodes 125 and 127, third gate electrodes 130 and 132, fourth gate electrodes 135 and 137, and fifth gate electrodes 140 and 142.

The active pattern 111 and the gate electrodes 120, 125, 130, 135, and 140 may be similar to the active pattern 110 and gate electrodes 120, 125, 130, 135, and 140, respectively disposed at a corresponding position as described with reference to FIG. 4.

In one embodiment, the active pattern 112 on a pixel (N+1) in odd row and gate electrodes 122, 127, 132, 137, and 142 may be vertically symmetrical with the active pattern 110 and gate electrodes 120, 125, 130, 135, and 140 described with reference to FIG. 4. Therefore, the active pattern 111 corresponding to a pixel (N) in an even row may have a vertically symmetric shape with the active pattern 112 corresponding to a pixel (N+1) in an odd row with respect to an axis extending in the first direction and an axis extending in the second direction.

In one embodiment, each of active patterns 111 and 112 may include first to eighth areas (a, b, c, d, e, f, g, h).

In one embodiment, as the active pattern 112 on a pixel (N+1) in an odd row may be symmetrically disposed in the vertical direction, a channel of a first transistor (TR1) overlapping the first gate electrodes 120 and 122 may have the same shape in an even (N) row and an odd (N+1) row. Therefore, if misalignment occurs during a manufacturing process, the pixel circuit of an even (N) row and the pixel circuit of an odd (N+1) row may have the same electrical properties.

In one embodiment, a first insulating interlayer may be on the gate insulating layer, and thus the first insulating interlayer may cover gate electrodes 120, 122, 125, 127, 130, 132, 135, 137, 140, and 142. First conductive patterns 150 and 151 and second conductive patterns 155 and 156 described with reference to FIG. 5 may be disposed on the first insulating interlayer. A second insulating interlayer covering those may be on the first insulating interlayer.

Referring to FIG. 16, wirings 160, 161, 165, and 170, first connecting patterns 175 and 176, and second connecting patterns 177' and 178' may be on the second insulating interlayer. The wirings 160, 161, 165, and 170 and the first connecting patterns 175 and 176 may be similar to those in FIG. 12, except that the second connecting patterns 177' and 178' may have different locations and shapes.

Referring to FIG. 17, an embodiment may further include wirings 160, 161, 165, and 170, a third insulating interlayer covering connecting patterns 175, 176, 177, and 178 and pixel electrodes 200G1, 200G2, 200R, and 200B on the third insulating interlayer. For convenience of description, only wirings 160, 161, 165, and 170, connecting patterns 175, 176, 177, and 178 and pixel electrodes 200G1, 200G2, 200R, and 200B are illustrated in FIG. 17.

Except for the shape of some connecting portions 204G and 204B, the wirings 160, 161, 165, and 170, connecting patterns 175, 176, 177, and 178 and pixel electrodes 200G1, 200G2, 200R, and 200B may be similar to those in FIGS. 13 and 14.

In one embodiment, the active pattern 112 of an odd-numbered (N+1) row may have a symmetrical shape with respect to the active pattern 111 of an even-numbered (N) row in the vertical and horizontal directions. Therefore, a channel of a first transistor (TR1) in an odd-numbered (N+1) row may have the same shape as a channel of a first transistor (TR1) in an even-numbered (N) row, and thus a disparity in their electrical properties may be reduced.

Figure 18:
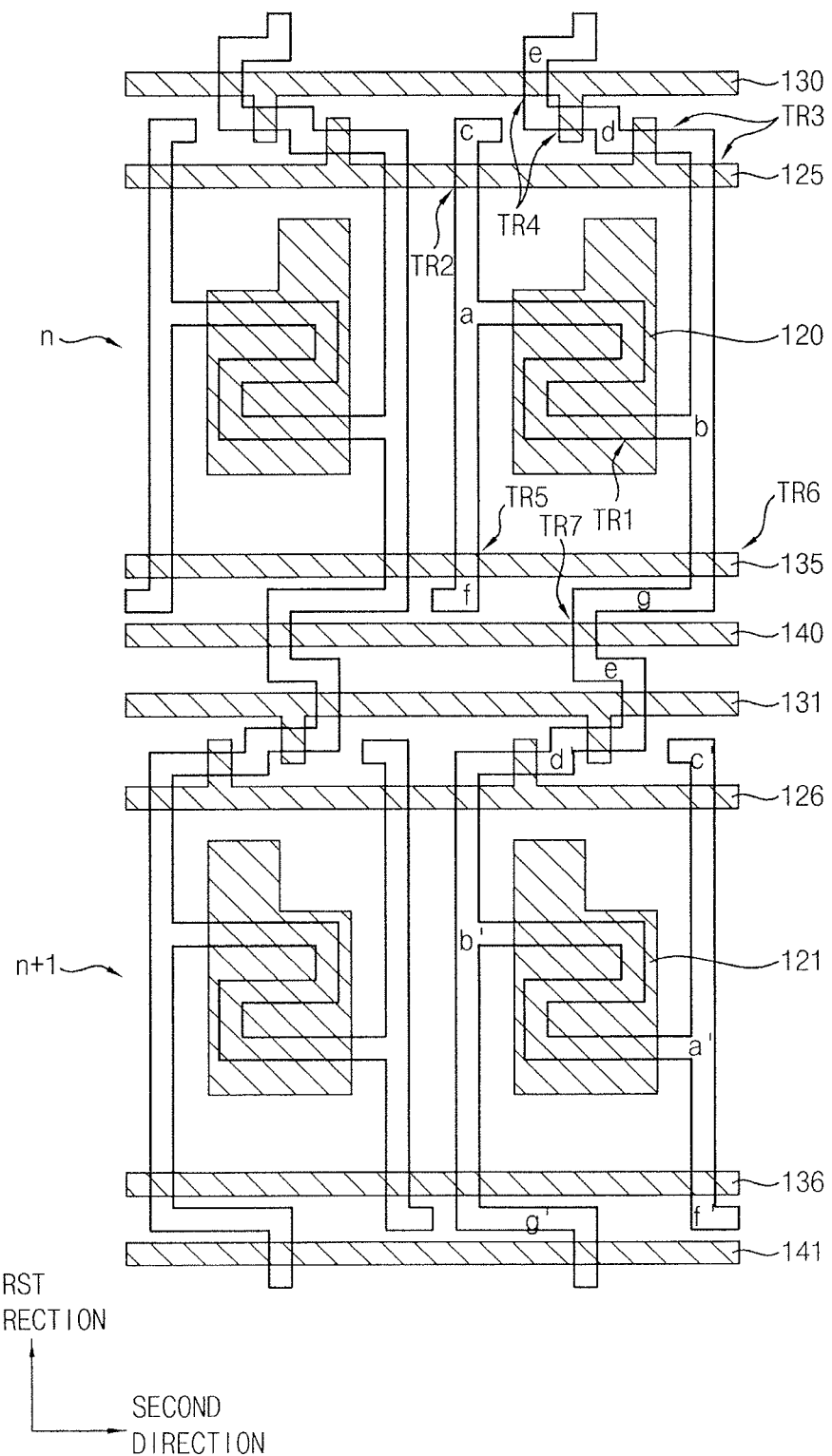
FIG. 18 illustrates another example of a layout of pixels.

FIG. 18 illustrates a top plan view illustrating another layout embodiment of pixels. Referring to FIG. 18, this embodiment includes a substrate, an active pattern 113, a first gate insulating layer, first gate electrodes 120 and 121, second gate electrodes 125 and 126, third gate electrodes 130 and 131, fourth gate electrodes 135 and 136, and fifth gate electrodes 140 and 141. Except for the shape of the active pattern 113, this embodiment may be similar to any of those in FIGS. 1 to 9.

The active pattern 113 may be similar to the active pattern 110 in FIG. 4, except for the shape of a portion overlapping the first gate electrode 121. For example, in the active pattern 113, a portion overlapping a first gate electrode 120 in an even-numbered (N) row and a portion overlapping a first gate electrode 121 in an odd-numbered (N+1) row may have the same shape. Therefore, a channel of a first transistor (TR1) in an odd-numbered (N+1) row may have the same shape as a channel of a first transistor (TR1) in an even-numbered (N) row, and thus a disparity of their electrical properties may be reduced.

By way of summation and review, one type of pixel circuit which has been proposed includes only one data wiring corresponding to one pixel column. Thus, as the resolution of the display increases, a pixel writing time is decreased. In accordance with one or more embodiments, a pixel circuit includes two data wirings corresponding to one pixel column to thereby increase (e.g., double) the pixel writing time. Also, a power supply wiring is between two data wirings to reduce or prevent a coupling effect between the two data wirings. Also, active patterns of a pixel in odd row and a pixel in even row have substantially a same shape so that these pixels have substantially the same electrical properties.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An organic light emitting display device (OLED), comprising:
    a plurality of pixel columns on a substrate, the pixel columns including a plurality of pixels repeatedly arranged in a column direction, the pixel columns being repeatedly arranged along a row direction;
    a first data wiring extending in the column direction, the first data wiring connected to the pixels in even rows of a column;
    a second data wiring extending in the column direction, the second data wiring connected to the pixels in odd rows of the column; and
    a first power supply wiring extending between the first data wiring and the second data wiring, the first and second data wirings being connected to the pixels of the same column and extending along opposite sides of the pixels of the same column, respectively, wherein
    the first power supply wiring extends between the pixels in the even rows of the column and the pixels in the odd rows of the column in the row direction, and wherein:
    the first power supply wiring is closer to the first data wiring than the second data wiring when the first power supply wiring extends in the column direction and passes through the pixels in the even rows of the column, and
    the first power supply wiring is closer to the second data wiring than the first data wiring when the first power supply wiring extends in the column direction and passes through the pixels in the odd rows of the column.

2. The OLED as claimed in claim 1, wherein each of the pixels includes:

an active pattern including a first region, a second region, and a third region on the substrate;
a first gate electrode partially overlapping the active pattern, a first transistor including the first gate electrode, the first region, and the second region; and
a second gate electrode partially overlapping the active pattern, a second transistor including the second gate electrode, the second region, and the third region, wherein the first transistor generates a driving current supplied to an organic light emitting diode.

3. The OLED as claimed in claim 2, wherein:
the active pattern includes a fourth region, a fifth region, a sixth region, and a seventh region, and
a third transistor includes the second gate electrode, the first region, and the seventh region.

4. The OLED as claimed in claim 3, wherein:
the first data wiring is connected to the fourth region of the active pattern corresponding to the pixels in the even rows, and
the second data wiring is connected to the fourth region of the active pattern corresponding to the pixels in the odd rows.

5. The OLED as claimed in claim 3, wherein each of the pixels includes:
a second gate electrode overlapping the active pattern, a third transistor including the second gate electrode, the first region, and the fourth region, a fourth transistor including the second gate electrode, the second region, and the fifth region;
a third gate electrode partially overlapping the active pattern, the second transistor including the third gate electrode, the fifth region, and the sixth region; and
a fifth gate electrode partially overlapping the active pattern, the third transistor including the fifth gate electrode, the sixth region, and the third region.

6. The OLED as claimed in claim 5, wherein the active pattern and the first to fifth gate electrodes corresponding to the pixels in the even rows are symmetrical with the active pattern and the first to fifth gate electrodes of the pixels in the odd rows with respect to an axis extending in the column direction.

7. The OLED as claimed in claim 5, wherein the active pattern and the first to fifth gate electrodes corresponding to the pixels in the even rows are symmetrical with the active pattern and the first to fifth gate electrodes corresponding to the pixels in the odd rows with respect to an axis extending in the row direction.

8. The OLED as claimed in claim 5, wherein:
a portion of the active pattern corresponding to the pixels in the even rows which overlap the first gate electrode have substantially a same shape as a portion of the active pattern corresponding to the pixels in the odd rows which overlaps the first gate electrode, and
a remaining portion of the active pattern corresponding to the pixels in the even rows and the first to fifth gate electrodes are symmetrical with a remaining portion of the active pattern corresponding to the pixels in the odd rows and the first to fifth gate electrodes with respect to an axis extending in the column direction.

9. The OLED as claimed in claim 2, wherein a channel of the first transistor in one of the pixels of the even rows and a channel of the first transistor in one of the pixels of the odd rows have substantially a same planar shape.

10. The OLED as claimed in claim 2, further comprising:
a plurality of pixel electrodes, each of the pixel electrodes connected to the third region of the active pattern;
an organic light emitting layer on each of the pixel electrodes; and
a common electrode on the organic light emitting layer, wherein a light emitting diode includes one of the pixel electrodes, the organic light emitting layer, and the common electrode.

11. The OLED as claimed in claim 10, wherein the pixel electrodes are arranged along the column direction and the row direction and are staggered relative to each other.

12. The OLED as claimed in claim 10, wherein the pixel electrodes include:
a first pixel electrode connected to one of the pixels in the odd rows of an even pixel column, the first pixel electrode in a first light emitting diode emitting a first color;
a second pixel electrode connected to one of the pixels in the even rows of the even pixel column, the second pixel electrode in a second light emitting diode emitting a second color;
a third pixel electrode connected to one of the pixels in the odd rows of an odd pixel column, the third pixel electrode in a third light emitting diode emitting a third color; and
a fourth pixel electrode connected to one of the pixels in the even rows of the odd pixel column, the fourth pixel electrode in a fourth light emitting diode emitting a third color.

13. The OLED as claimed in claim 10, wherein the pixel electrodes include:
a first pixel electrode connected to one of the pixels in the even rows of an even pixel column, the first pixel electrode in a first light emitting diode emitting a first color;
a second pixel electrode connected to one of the pixels in the even rows of an odd pixel column, the second pixel electrode in a second light emitting diode emitting a second color;
a third pixel electrode connected to one of the pixels in the odd rows of the even pixel column, the third pixel electrode in a third light emitting diode emitting a third color; and
a fourth pixel electrode connected to one of the pixels in the odd rows of the odd pixel column, the fourth pixel electrode in a fourth light emitting diode emitting a third color.

14. The OLED as claimed in claim 13, wherein the first color is red, the second color is blue, and the third color is green.

15. The OLED as claimed in claim 10, wherein the pixel electrodes have a substantially diamond shape including sides extending in the column direction and the row direction.

16. The OLED as claimed in claim 15, further comprising a connecting portion integral with the pixel electrodes.

17. The OLED as claimed in claim 1, wherein:
the first power supply wiring is to be supplied with an internal voltage,
the first data wiring is to be supplied with an even data signal, and
the second data wiring is to be supplied with an odd data signal.

18. The OLED as claimed in claim 17, wherein the first data wiring and the second data wiring are connected to a demultiplexer.

19. The OLED as claimed in claim 17, wherein the even data signal and the odd data signal are separated in time.

20. The OLED as claimed in claim 17, wherein a driving time of one of the pixels in the odd rows partially overlaps a driving time of an adjacent one of the pixels in the even rows.

21. The OLED as claimed in claim 1, wherein the first power supply wiring extends to cross between the opposite sides of the pixels of the same column in the row direction.

22. An organic light emitting display device (OLED), comprising:
- a plurality of pixel columns on a substrate, the pixel columns including a plurality of pixels repeatedly arranged in a first direction, the pixel columns being repeatedly arranged along a second direction, the first direction and the second direction being substantially parallel to a top surface of the substrate and substantially perpendicular to each other;
- a first data wiring extending in the first direction, the first data wiring connected to the pixels in even rows of a column;
- a second data wiring extending in the first direction, the second data wiring connected to the pixels in odd rows of the column; and
- a first power supply wiring extending between the first data wiring and the second data wiring, wherein each pixel includes:
- a first transistor to perform data writing operation which includes transferring a data signal from the first data wiring or the second data wiring, and
- a second transistor to perform a threshold voltage compensation operation for a driving transistor, the first transistor to perform the data writing operation and the second transistor to perform the threshold voltage compensation operation for a first pixel before the first transistor and the second transistor in an adjacent second pixel in a same column are to perform the data writing operation and the threshold voltage compensation operation for the second pixel.

* * * * *